United States Patent
Hu

(10) Patent No.: US 9,419,161 B2
(45) Date of Patent: Aug. 16, 2016

(54) HYBRID MULTI-SPECTRUM PHOTOSENSITIVE PIXEL GROUP, PHOTOSENSITIVE DEVICE, AND PHOTOSENSITIVE SYSTEM

(75) Inventor: Xiaoping Hu, Guangdong (CN)

(73) Assignee: Boly Media Communications (Shenzhen) Co., Ltd., Guangdong (CN)

( * ) Notice: Subject to any disclaimer, the term of this patent is extended or adjusted under 35 U.S.C. 154(b) by 381 days.

(21) Appl. No.: 14/128,923

(22) PCT Filed: Jun. 24, 2011

(86) PCT No.: PCT/CN2011/076335
§ 371 (c)(1),
(2), (4) Date: Mar. 7, 2014

(87) PCT Pub. No.: WO2012/174751
PCT Pub. Date: Dec. 27, 2012

(65) Prior Publication Data
US 2014/0209789 A1   Jul. 31, 2014

(51) Int. Cl.
*H01L 27/00* (2006.01)
*H01L 31/0352* (2006.01)
*H01L 27/144* (2006.01)
*H01L 27/146* (2006.01)
*H01L 27/30* (2006.01)

(52) U.S. Cl.
CPC .... *H01L 31/035218* (2013.01); *H01L 27/1443* (2013.01); *H01L 27/14625* (2013.01); *H01L 27/14641* (2013.01); *H01L 27/14647* (2013.01); *H01L 27/14652* (2013.01); *H01L 27/14621* (2013.01); *H01L 27/307* (2013.01)

(58) Field of Classification Search
CPC .............. H01L 27/1465; H01L 27/14652
USPC ............................................. 250/208.1
See application file for complete search history.

(56) References Cited

U.S. PATENT DOCUMENTS

| 2005/0017176 A1* | 1/2005 | Koch | B82Y 10/00 250/338.4 |
| 2009/0200589 A1* | 8/2009 | Qian | H01L 27/14603 257/292 |
| 2011/0155233 A1* | 6/2011 | Liu | H01L 31/0352 136/256 |

\* cited by examiner

Primary Examiner — Thanh Luu
(74) Attorney, Agent, or Firm — Ohlandt, Greeley, Ruggiero & Perle, L.L.P.

(57) ABSTRACT

The present invention relates to a mixed multi-spectrum light-sensing pixel group, a light-sensing device, and a light-sensing system. The mixed multi-spectrum light-sensing pixel group includes at least one chemical coating light-sensing pixel and at least one semiconductor light-sensing pixel. In the present invention, the chemical coating light-sensing pixel and the semiconductor light-sensing pixel are combined to generate a mixed multi-spectrum light-sensing pixel, numerous color signals and other spectral signals may be simultaneously obtained, energy of incident photons can be maximally utilized, and the theoretical upper limit of photoelectric conversion efficiency is achieved or approximately achieved; colors may be completely reconstructed, and meanwhile images of other spectrums including an ultraviolet image, a near-infrared image, and a far-infrared image are obtained.

9 Claims, 16 Drawing Sheets

(a)

(b)

(a)

(b)

US 9,419,161 B2

HYBRID MULTI-SPECTRUM PHOTOSENSITIVE PIXEL GROUP, PHOTOSENSITIVE DEVICE, AND PHOTOSENSITIVE SYSTEM

BACKGROUND OF THE INVENTION

1. Field of the Invention

The present invention relates to the light-sensing field, and specifically, to a mixed multi-spectrum light-sensing pixel group, a light-sensing device, and a light-sensing system.

2. Related Art

The present invention is continuation to "multi-spectrum light-sensing device and manufacturing method for same" (PCT/CN2007/071262), "multi-spectrum light-sensing device and manufacturing method for same" (Chinese Application No: 200810217270.2), "multi-spectrum light-sensing device" (Chinese Application No: 200910105372.X), "multi-spectrum light-sensing device and sampling method for same" (Chinese Application No: 200910105948.2), and "light-sensing device and reading method for same, and reading circuit" (Chinese Application No: 200910106477.7) applied by the inventor at an earlier time, aiming to provide more specific and preferable implementation at a chip and system grade.

The present inventions listed above mainly relate to a method and a system for manufacturing and reading a multi-spectrum light-sensing chip with a semiconductor as a main body. These new technologies and inventions enormously improve performances and application manners of a semiconductor light-sensing device, but are still subjected to two basic limitations of the semiconductor light-sensing device itself: (1) the bandgap is small, so that infrared induction is greatly limited; and (2) the semiconductor quantum efficiency is only about 50%.

Recently, U.S. patent application entitled "Materials, Systems and Methods for Optoelectronic Devices" (PCT/US2008/060947, WO2008/131313) proposes a method for manufacturing a light-sensing pixel by use of a quantum (light-sensing) film formed of quantum dots (as shown in FIG. 1 to FIG. 4). In the application, a quantum coating which is more sensitive to a light signal and whose bandgap is wider is invented, where the character that the magnitude of the quantum dot size (namely, quantum dot diameter) has a frequency selection characteristic is utilized to implement induction of different colors, and this quantum coating is capable of providing higher photoelectric conversion efficiency, and capable of providing a wider-frequency-spectrum response characteristic (as shown in FIG. 5). The quantum dot light-sensing pixel mentioned in the application is actually a special case of a more generalized chemical coating light-sensing pixel, and the idea adopted for the chemical coating light-sensing pixel is as follows: basically a bias voltage is applied on a chemical coating, then free electrons (or holes) are induced by light illumination to run away, and the free electrons (or holes) are induced to the surface layer of the coating by the bias voltage to accumulate charges, thereby implementing photosensitivity. By means of the present invention, a light filtering film and an additional semiconductor reading layer are required, while the light-sensing efficiency of the chemical coating light-sensing device is limited due to use of the light filtering film.

Therefore, there is a more advanced preferable implementation method, so as to obtain better light-sensing effect. For example, when multi-spectrum light-sensing is performed, there is still an improvement space for how to better give consideration to demands for both color and sensitivity, and how to approximate to or achieve the ideal orthogonal characteristic required by the color light-sensing device (as response curves of red, green, and blue shown in FIG. 6) so as to have the highest photoelectric conversion efficiency simultaneously.

SUMMARY OF THE INVENTION

The technical problem to be solved by the present invention is to provide a mixed multi-spectrum light-sensing pixel group, a light-sensing device, and a light-sensing system, which combine advantages of a semiconductor (CCD or CMOS) light-sensing device and a chemical coating (such as, quantum film) light-sensing device, so as to obtain a multi-spectrum light-sensing device which achieves or almost achieves the theoretical limit of the light use efficiency.

To solve the foregoing technical problem, the present invention adopts the following technical solutions.

A mixed multi-spectrum light-sensing pixel group includes at least one chemical coating light-sensing pixel and at least one semiconductor light-sensing pixel.

In an embodiment of the present invention, in the light-sensing pixel group, the at least one chemical coating light-sensing pixel and the at least one semiconductor light-sensing pixel are arranged on a same plane.

In an embodiment of the present invention, in the light-sensing pixel group, the at least one chemical coating light-sensing pixel and the at least one semiconductor light-sensing pixel are arranged as an up-and-down structure.

In an embodiment of the present invention, in the light-sensing pixel group, the at least one chemical coating light-sensing pixel is arranged above the at least one semiconductor light-sensing pixel.

In an embodiment of the present invention, in the light-sensing pixel group, the at least one chemical coating light-sensing pixel is arranged below the at least one semiconductor light-sensing pixel.

In an embodiment of the present invention, in the light-sensing pixel group, the chemical coating light-sensing pixel and the semiconductor light-sensing pixel are each one in number, and the chemical coating light-sensing pixel is arranged above or below the semiconductor light-sensing pixel; or the chemical coating light-sensing pixel is two in number, the semiconductor light-sensing pixel is one in number, and the semiconductor light-sensing pixel is arranged above, between, or below the two chemical coating light-sensing pixels; or the semiconductor light-sensing pixel is two in number, the chemical coating light-sensing pixel is one in number, and the chemical coating light-sensing pixel is arranged above, between, or below the two semiconductor light-sensing pixels; or the chemical coating light-sensing pixel and the semiconductor light-sensing pixel are each two in number, one of the two chemical coating light-sensing pixels is arranged above the two semiconductor light-sensing pixels, and the other thereof is arranged below the two semiconductor light-sensing pixels; or one of the two chemical coating light-sensing pixels is arranged above the two semiconductor light-sensing pixels, and the other thereof is arranged between the two semiconductor light-sensing pixels; or one of the two chemical coating light-sensing pixels is arranged below the two semiconductor light-sensing pixels, and the other thereof is arranged between the two semiconductor light-sensing pixels; or the chemical coating light-sensing pixel is one in number, the semiconductor light-sensing pixel is three in number, and the chemical coating light-sensing pixel is arranged above or below the three semiconductor light-sensing pixels.

In an embodiment of the present invention, in the light-sensing pixel group, the at least one chemical coating light-sensing pixel or the at least one semiconductor light-sensing pixel is a front-side light-sensing pixel, a back-side light-sensing pixel, or a bidirectional light-sensing pixel.

In an embodiment of the present invention, in the light-sensing pixel group, when the chemical coating light-sensing pixel or the semiconductor light-sensing pixel is a bidirectional light-sensing pixel, a manner of selection of a direction by light-sensing thereof is selection of a direction by isolation, selection of a direction by time division, selection of a direction by area division, or selection of a direction by a pixel.

In an embodiment of the present invention, in the light-sensing pixel group, the chemical coating light-sensing pixel and the semiconductor light-sensing pixel each induce a complementary band or sub-band of ultraviolet, visible light, near-infrared, and far-infrared; or the chemical coating light-sensing pixel and the semiconductor light-sensing pixel each induce an orthogonal band or a sub-band of ultraviolet, visible light, near-infrared, and far-infrared.

A mixed multi-spectrum light-sensing device proposed in the present invention includes at least one chemical coating light-sensing pixel and at least one semiconductor light-sensing pixel.

In an embodiment of the present invention, in the light-sensing device, the at least one chemical coating light-sensing pixel and the at least one semiconductor light-sensing pixel are arranged on a same plane.

In an embodiment of the present invention, the light-sensing device includes at least two light-sensing pixel layers, the at least one chemical coating light-sensing pixel is arranged at one of the at least two light-sensing pixel layers, and the at least one semiconductor light-sensing pixel is arranged at the other of the at least two light-sensing pixel layers.

In an embodiment of the present invention, in the light-sensing device, the light-sensing pixel layers at least include a chemical coating light-sensing pixel layer and a semiconductor light-sensing pixel layer.

In an embodiment of the present invention, in the light-sensing device, the at least one chemical coating light-sensing pixel layer is arranged above the at least one semiconductor light-sensing pixel layer.

In an embodiment of the present invention, in the light-sensing device, the at least one chemical coating light-sensing pixel layer is arranged below the at least one semiconductor light-sensing pixel layer.

In an embodiment of the present invention, in the light-sensing device, a pixel arrangement location of the at least one chemical coating light-sensing pixel layer and a pixel arrangement location of the at least one semiconductor light-sensing pixel layer are corresponding.

In an embodiment of the present invention, in the light-sensing device, light-sensing pixels at a same location but different layers each induce a complementary band or sub-band of ultraviolet, visible light, near-infrared, and far-infrared; or each induce an orthogonal band or a sub-band of ultraviolet, visible light, near-infrared, and far-infrared.

In an embodiment of the present invention, in the light-sensing device, the complementary band or sub-band includes ultraviolet spectrum, blue spectrum, green spectrum, red spectrum, near-infrared spectrum, far-infrared spectrum, cyan spectrum, yellow spectrum, white spectrum, near-infrared spectrum+far-infrared spectrum, red spectrum+near-infrared spectrum, red spectrum+near-infrared spectrum+far-infrared spectrum, yellow spectrum+near-infrared spectrum, yellow spectrum+near-infrared spectrum+far-infrared spectrum, visible spectrum+near-infrared spectrum+far-infrared spectrum, ultraviolet spectrum+visible spectrum, ultraviolet spectrum+visible spectrum+near-infrared spectrum, and ultraviolet spectrum+visible spectrum+near-infrared spectrum+far-infrared spectrum; and the orthogonal band or sub-band includes ultraviolet spectrum, blue spectrum, green spectrum, red spectrum, near-infrared spectrum, far-infrared spectrum, cyan spectrum, yellow spectrum, white spectrum, near-infrared spectrum+far-infrared spectrum, red spectrum+near-infrared spectrum, red spectrum+near-infrared spectrum+far-infrared spectrum, yellow spectrum+near-infrared spectrum, yellow spectrum+near-infrared spectrum+far-infrared spectrum, visible spectrum+near-infrared spectrum+far-infrared spectrum, ultraviolet spectrum+visible spectrum, ultraviolet spectrum+visible spectrum+near-infrared spectrum, and ultraviolet spectrum+visible spectrum+near-infrared spectrum+far-infrared spectrum.

In an embodiment of the present invention, in the light-sensing device, color arrangement in each light-sensing pixel layer includes same arrangement, horizontal arrangement, vertical arrangement, diagonal arrangement, generalized Bayesian arrangement, YUV422 arrangement, transverse YUV422 arrangement, honeycomb arrangement, and uniform arrangement.

In an embodiment of the present invention, in the light-sensing device, the at least one chemical coating light-sensing pixel or the at least one semiconductor light-sensing pixel is a front-side light-sensing pixel, a back-side light-sensing pixel, or a bidirectional light-sensing pixel.

In an embodiment of the present invention, in the light-sensing device, when the chemical coating light-sensing pixel or the semiconductor light-sensing pixel is a bidirectional light-sensing pixel, a manner of selection of a direction by light-sensing thereof is selection of a direction by isolation, selection of a direction by time division, selection of a direction by area division, or selection of a direction by a pixel.

In an embodiment of the present invention, in the light-sensing device, the at least one chemical coating light-sensing pixel layer and the at least one semiconductor light-sensing pixel layer are disposed on a substrate:

the light-sensing device is a single-sided double-layered light-sensing device, including a chemical coating light-sensing pixel layer and a semiconductor light-sensing pixel layer, and the chemical coating light-sensing pixel layer and the semiconductor light-sensing pixel layer are arranged at the top or bottom of the substrate; or the light-sensing device is a double-sided double-layered light-sensing device, including a chemical coating light-sensing pixel layer and a semiconductor light-sensing pixel layer, the chemical coating light-sensing pixel layer is arranged at the top or bottom of the substrate, and the semiconductor light-sensing pixel layer is arranged at the bottom or top of the substrate; or the light-sensing device is a single-sided three-layered light-sensing device, including a chemical coating light-sensing pixel layer and two semiconductor light-sensing pixel layers, and the chemical coating light-sensing pixel layer and the two semiconductor light-sensing pixel layers are arranged at the top or bottom of the substrate; or the light-sensing device is a double-sided three-layered light-sensing device, including a chemical coating light-sensing pixel layer and two semiconductor light-sensing pixel layers, the chemical coating light-sensing pixel layer is arranged at the top or bottom of the substrate, and the two semiconductor light-sensing pixel layers are arranged at the bottom or top of the substrate; or one of the two semiconductor light-sensing pixel layers is arranged at the top of the substrate, and the other thereof is arranged at the bottom of the substrate; or the light-sensing device is a double-sided three-layered light-sensing device, including two chemical coating light-sensing pixel layers and a semiconductor light-sensing pixel layer, one of the two chemical coating light-sensing pixel layers is arranged at the top of the substrate, the other thereof is arranged at the bottom of the substrate, and the semiconductor light-sensing pixel layer is arranged at the top or bottom of the substrate; or the light-sensing device is a double-sided four-layered light-sensing device, including two chemical coating light-sensing pixel layers and two semiconductor light-sensing pixel layers, the two semiconductor light-sensing pixel layers are arranged at the bottom or top of the substrate, one of the two chemical coating light-sensing pixel layers is arranged above the top, and the other thereof is arranged below the bottom; or the two chemical coating light-sensing pixel layers are arranged at the top or bottom of the substrate, one of the two semiconductor light-sensing pixel layers is arranged above the top, and the other thereof is arranged below the bottom; or the light-sensing device is a double-sided four-layered light-sensing device, including a chemical coating light-sensing pixel layer and three semiconductor light-sensing pixel layers, the chemical coating light-sensing pixel layer is arranged at the top or bottom of the substrate, one of the three semiconductor light-sensing pixel layers is arranged at the top or bottom of the substrate, and the other two thereof are arranged at the bottom or top of the substrate; or the light-sensing device is a double-sided five-layered light-sensing device, including two chemical coating light-sensing pixel layers and three semiconductor light-sensing pixel layers, one of the two chemical coating light-sensing pixel layers is arranged at the top of the substrate, the other thereof is arranged at the bottom of the substrate, one of the three semiconductor light-sensing pixel layers is arranged at the top or bottom of the substrate, and the other two thereof are arranged at the bottom or top of the substrate; or the light-sensing device is a double-sided six-layered light-sensing device, including two chemical coating light-sensing pixel layers and four semiconductor light-sensing pixel layers, one of the two chemical coating light-sensing pixel layers is arranged at the top of the substrate, the other thereof is arranged at the bottom of the substrate, two of the four semiconductor light-sensing pixel layers are arranged at the top of the substrate, and the other two thereof are arranged at the bottom of the substrate.

In an embodiment of the present invention, in the light-sensing device, the at least one chemical coating light-sensing pixel layer is disposed on a substrate, and the at least one semiconductor light-sensing pixel layer is disposed on another substrate.

In an embodiment of the present invention, in the light-sensing device, a light-sensing pixel layer inducing light with a shorter wavelength is a light-sensing pixel layer closer to a light source.

In an embodiment of the present invention, the light-sensing device further includes light filtering films, where the light filtering films are disposed on a light-sensing pixel layer closest to the light source, or disposed on a light-sensing pixel layer farthest from the light source, or disposed between two light-sensing pixel layers, or disposed on a light-sensing pixel layer closest to the light source and a light-sensing pixel layer farthest from the light source; frequency selection characteristics of the light filtering film include infrared cut-off filtering, blue band-pass, green band-pass, red band-pass, cyan band-pass, yellow band-pass, pinkish red band-pass, cyan plus infrared band-pass, yellow plus infrared band-pass, pinkish red plus infrared band-pass, or visible light band-pass.

In an embodiment of the present invention, in the light-sensing device, two neighboring layers of the light-sensing pixel layers are each provided with a reading circuit; or two neighboring layers of the light-sensing pixel layers share a reading circuit.

In an embodiment of the present invention, in the light-sensing device, the reading circuit is a reading circuit for an active pixel, a reading circuit for a passive pixel, or a mixed reading circuit for an active pixel and a passive pixel.

In an embodiment of the present invention, in the light-sensing device, the active pixel includes an active pixel 3T, 4T, 5T or 6T.

In an embodiment of the present invention, in the light-sensing device, a sharing manner of the reading circuit includes a single-layered or upper-and-lower-layer 4-point sharing manner, a single-layered or upper-and-lower-layer 6-point sharing manner, a single-layered or upper-and-lower-layer 8-point sharing manner, or a single-layered or upper-and-lower-layer any-number-of-point sharing manner.

In an embodiment of the present invention, in the light-sensing device, the reading circuit includes a first combining unit configured to perform pair-wise combining and sampling on proximate same-row different-column, different-row same-column, or different-row different-column pixels in a pixel array of each light-sensing pixel layer, to obtain sampling data of a first combining pixel; and a second combining unit configured to perform combining and sampling on the sampling data of the first combining pixel obtained by the first combining unit to obtain sampling data of a second combining pixel.

In an embodiment of the present invention, in the light-sensing device, the reading circuit further includes a third combining unit, configured to perform combining and sampling on the sampling data of the second combining pixel obtained by the second combining unit to obtain sampling data of a third combining pixel.

In an embodiment of the present invention, in the light-sensing device, a pixel combining manner of the first combining unit or the second combining unit is a charge addition manner between same or different color pixels or a signal average manner between different color pixels, where the pixel combining manner between different color pixels conforms to a manner of color space conversion, so as to satisfy a color reconstruction requirement.

In an embodiment of the present invention, in the light-sensing device, the color space conversion includes space conversion from RGB to CyYeMgX, space conversion from RGB to YUV, or space conversion from CyYeMgX to YUV, where X is any one of R (red), G (green), and B (blue).

In an embodiment of the present invention, in the light-sensing device, the charge addition manner is completed by directly connecting pixels in parallel or simultaneously transferring charges into a reading capacitor (FD).

In an embodiment of the present invention, in the light-sensing device, a color based combining and sampling manner of the first combining unit or the second combining unit includes a same-color combining manner, a different-color combining manner, a hybrid combining manner, or a combining manner of selectively abandoning surplus colors, and the combining and sampling manner adopted by the first combining unit and the combining and sampling manner adopted by the second combining unit are not the same-color combining manner simultaneously.

In an embodiment of the present invention, in the light-sensing device, a location based combining and sampling manner of the first combining unit or the second combining unit includes at least one of the following several manners: an automatic average manner for a signal directly output to a bus, a row-skipping or column-skipping manner, and a one-by-one sampling manner.

In an embodiment of the present invention, in the light-sensing device, a combining and sampling manner of the third combining unit includes: at least one of a color space conversion manner and a backend digital image zoom manner.

In an embodiment of the present invention, in the light-sensing device, the chemical coating light-sensing pixel includes a quantum dot light-sensing pixel.

In an embodiment of the present invention, in the light-sensing device, the semiconductor light-sensing pixel includes a CMOS light-sensing diode, a CMOS light-sensing gate, a CCD light-sensing diode, a CCD light-sensing gate, and a CMOS and CCD light-sensing diode and light-sensing gate having a bidirectional charge transfer function.

A mixed multi-spectrum light-sensing system proposed in the present invention is implemented by adopting the foregoing light-sensing device.

Beneficial effects of the mixed multi-spectrum light-sensing pixel group, the light-sensing device and the system of the present invention lie in that: the chemical coating light-sensing pixel and the semiconductor light-sensing pixel have their respective advantages and disadvantages. Benefits of the chemical coating light-sensing pixel are in that the light-sensing sensitivity is high (particularly for the infrared light part), and the surface machining is convenient, but an additional semiconductor reading layer and a light filtering film are required (to obtain a color). The semiconductor light-sensing pixel does not need an additional semiconductor reading layer, but a problem of balance between light-sensing sensitivity and manufacturing difficulty exists. In the present invention, the chemical coating light-sensing pixel and the semiconductor light-sensing pixel are organically combined, and can learn strong points from each other to offset respective weaknesses, no additional semiconductor reading layer or light filtering film needs to be disposed, the difficulty of manufacturing the semiconductor light-sensing pixel is not increased, and high light-sensing sensitivity is provided, thereby exploiting respective advantages to the full; numerous color signals and other spectral signals may be simultaneously obtained, energy of incident photons can be maximally utilized, and the theoretical upper limit of photoelectric conversion efficiency is achieved or approximately achieved; colors may be completely reconstructed, and meanwhile images of other spectrums including an ultraviolet image, a near-infrared image, and a far-infrared image are obtained.

The present invention describes the innovative and powerful mixed multi-spectrum light-sensing pixel group, light-sensing device and system through embodiments. These preferable implementation manners are merely exemplified to illustrate advantages and implementation methods of the present invention, and are not intended to limit the protection scope of the present invention.

The foregoing objectives and advantages and other objectives and advantages of the present invention are very obvious after a person skilled in the art reads the following detailed description about preferable implementation cases with a plurality of illustrations and explanations.

Figure 7:
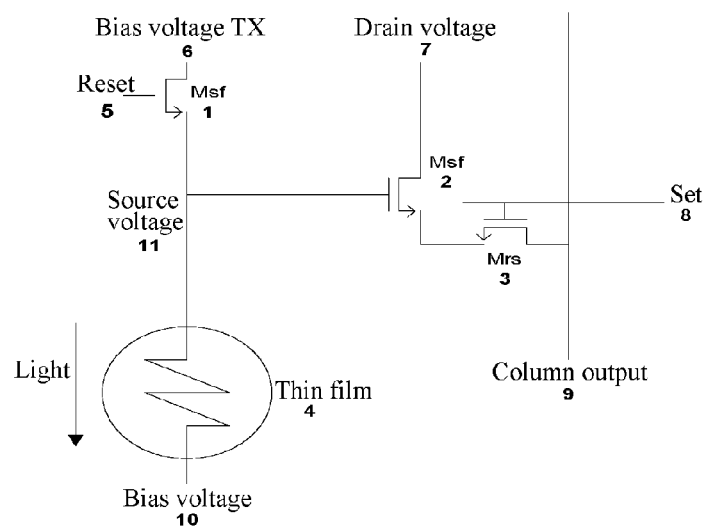
Figure 8:
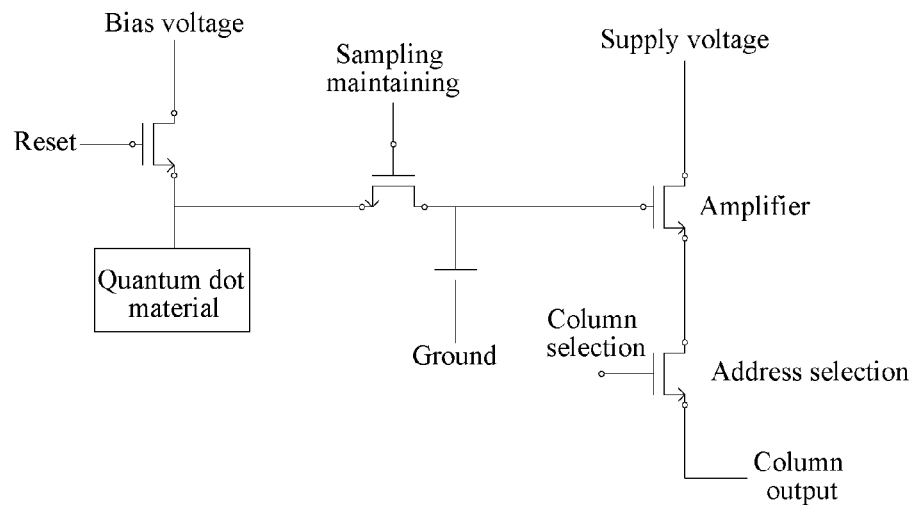
Figure 9:
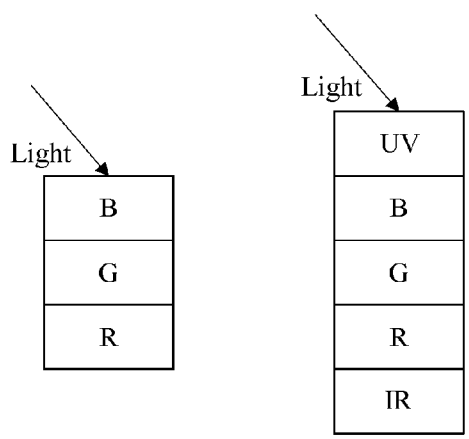
Figure 10:
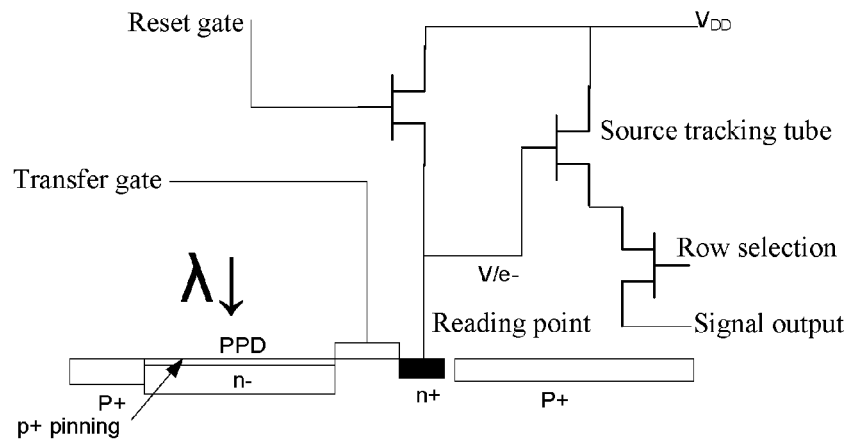
Figure 11:
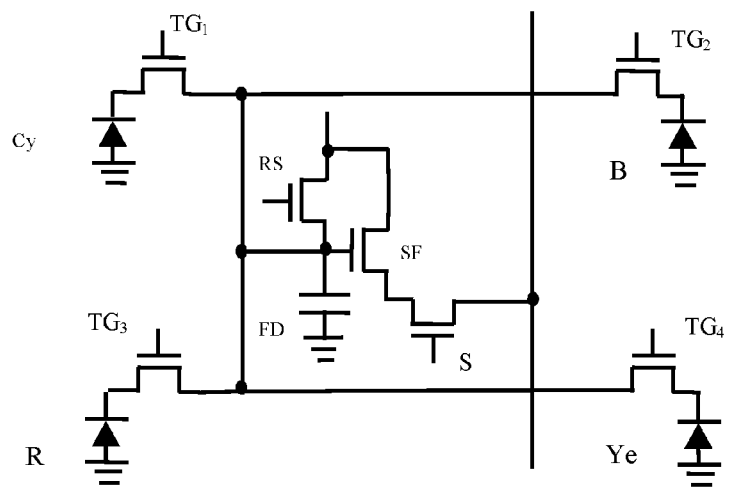
Figure 12:
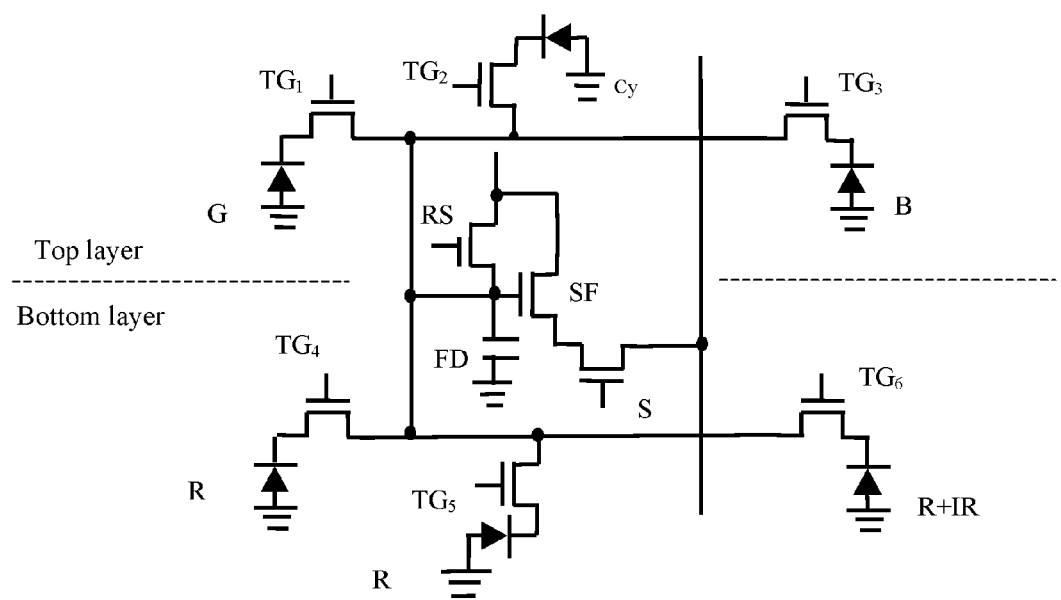
Figure 13:
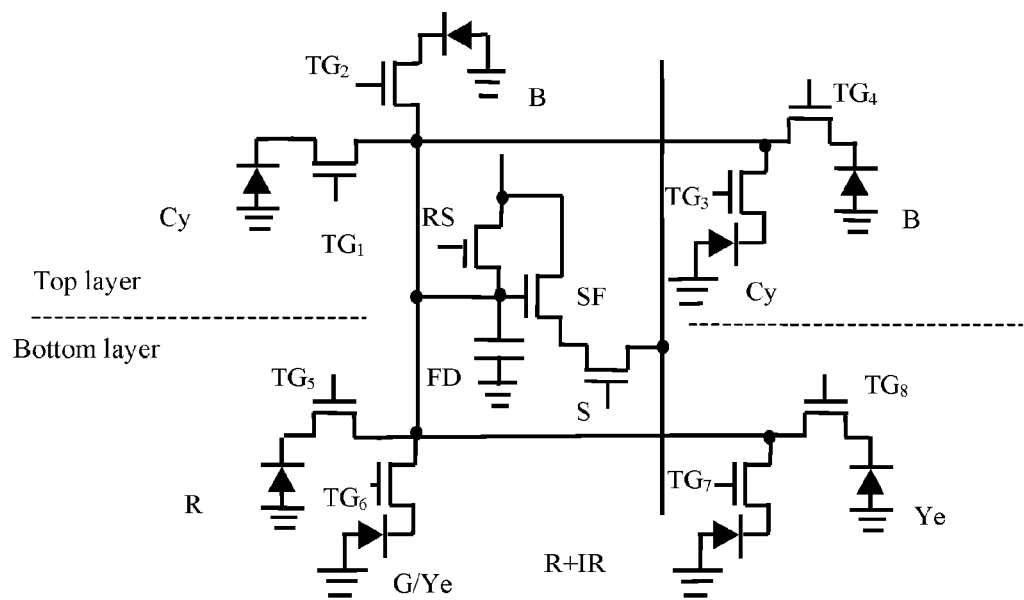
Figure 14:
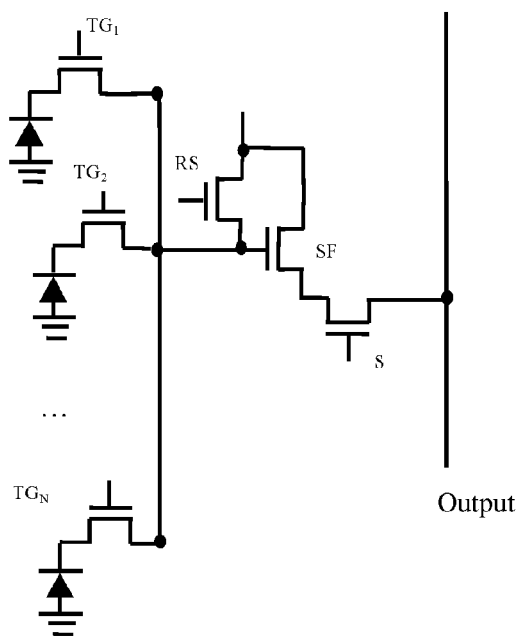
Figure 15:
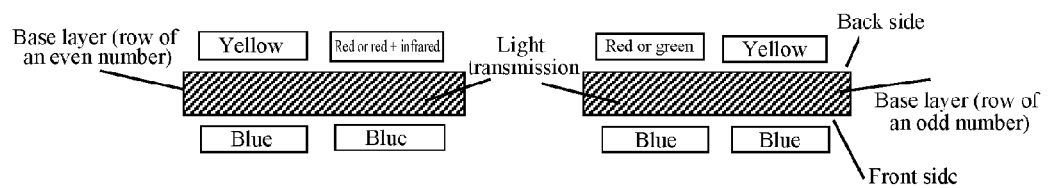
Figure 16:
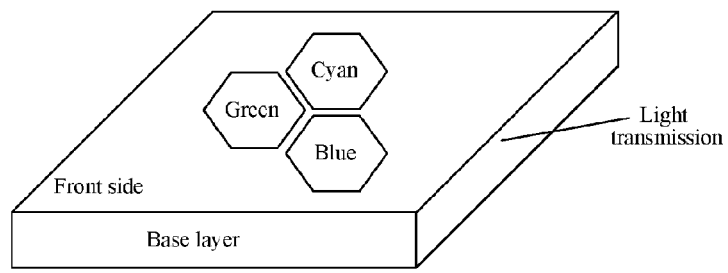
Figure 16:
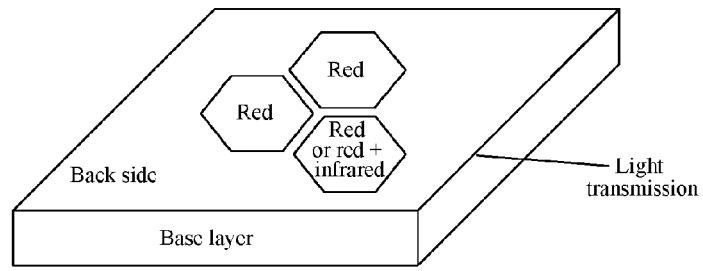
Figure 17:
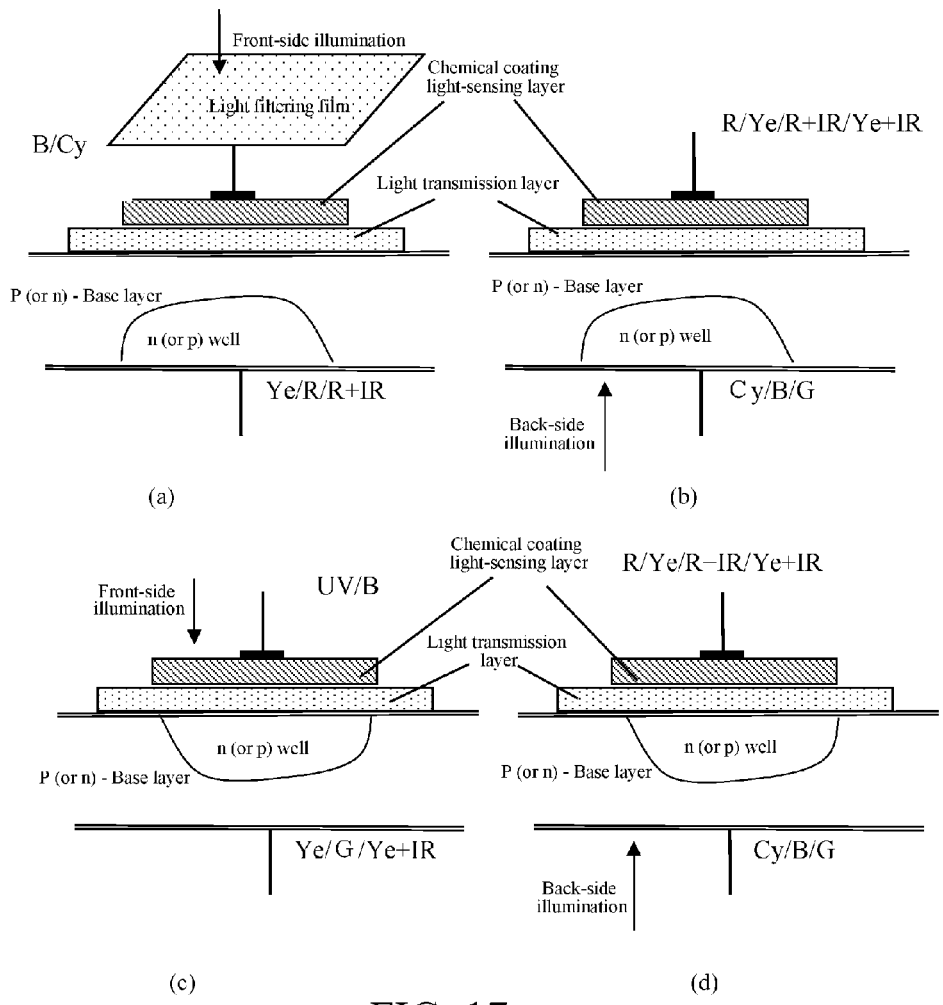
Figure 18:
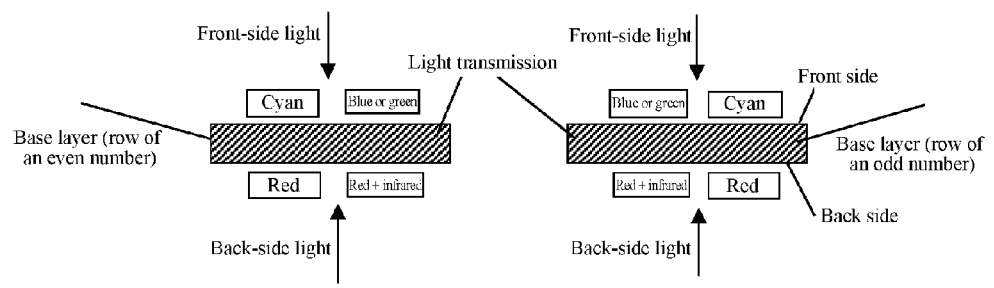
Figure 19:
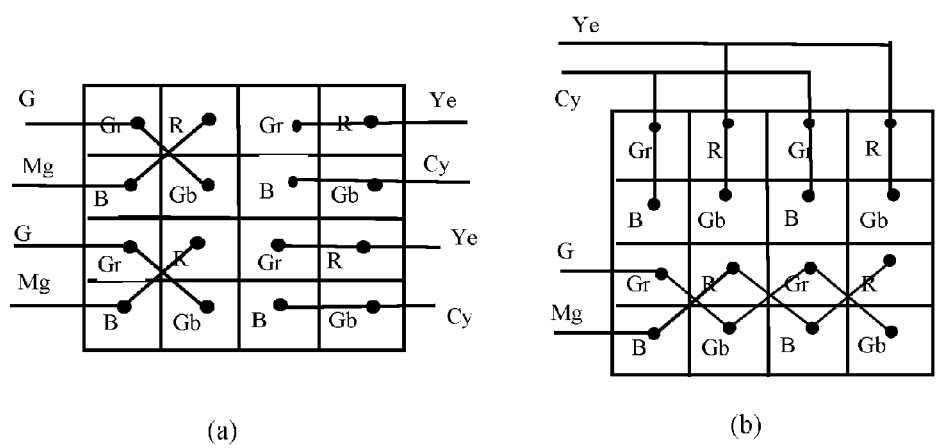
Figure 20:
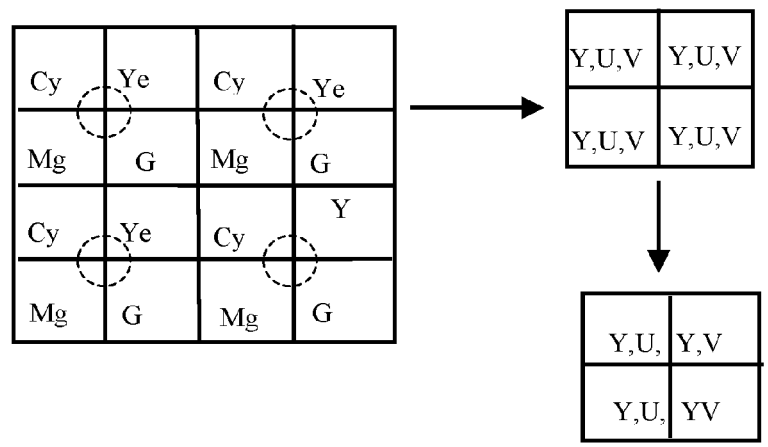
Figure 21:
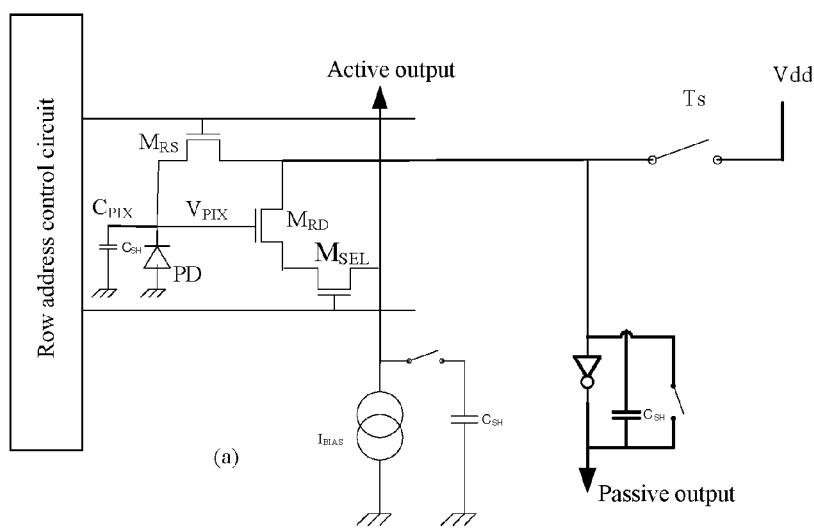
Figure 22:
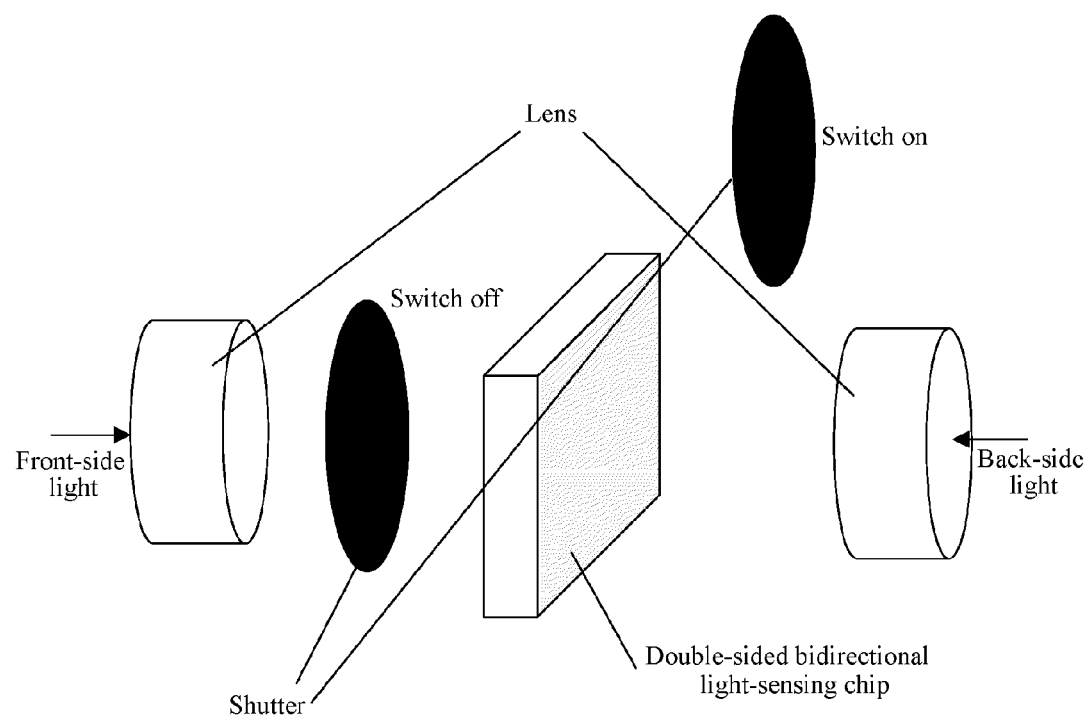
Figure 23:
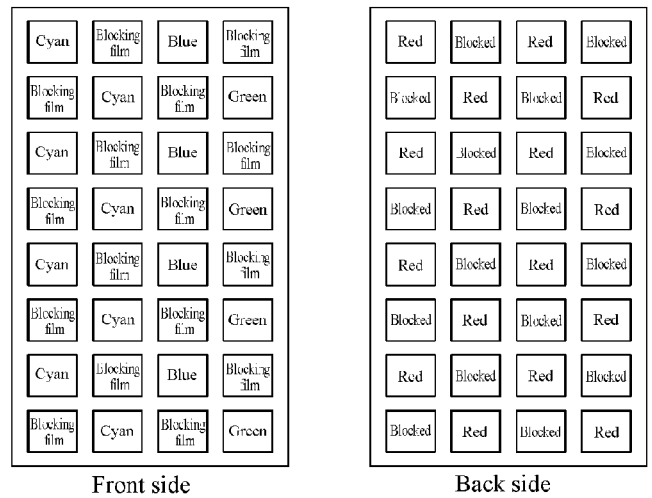
Figure 23:
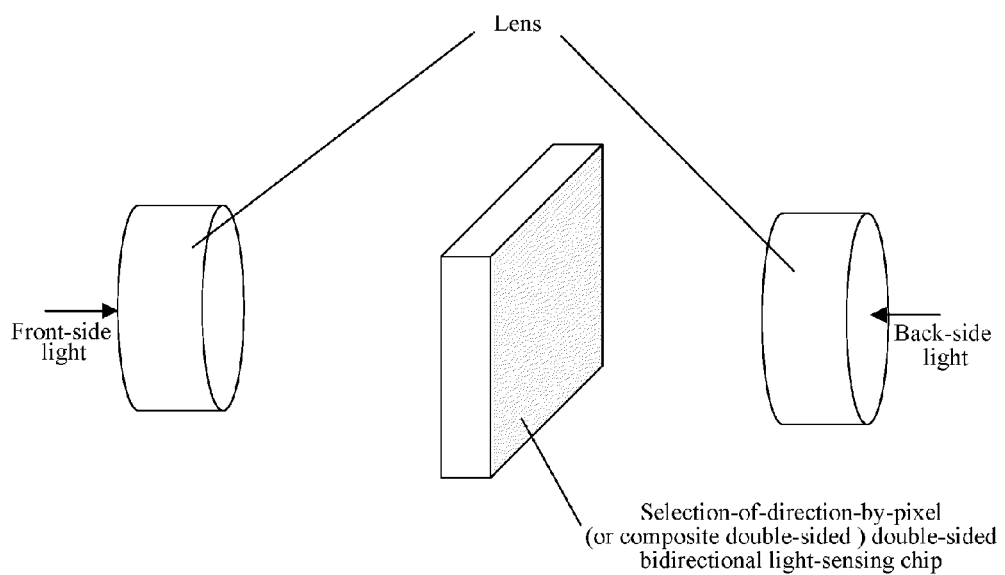
Figure 24:
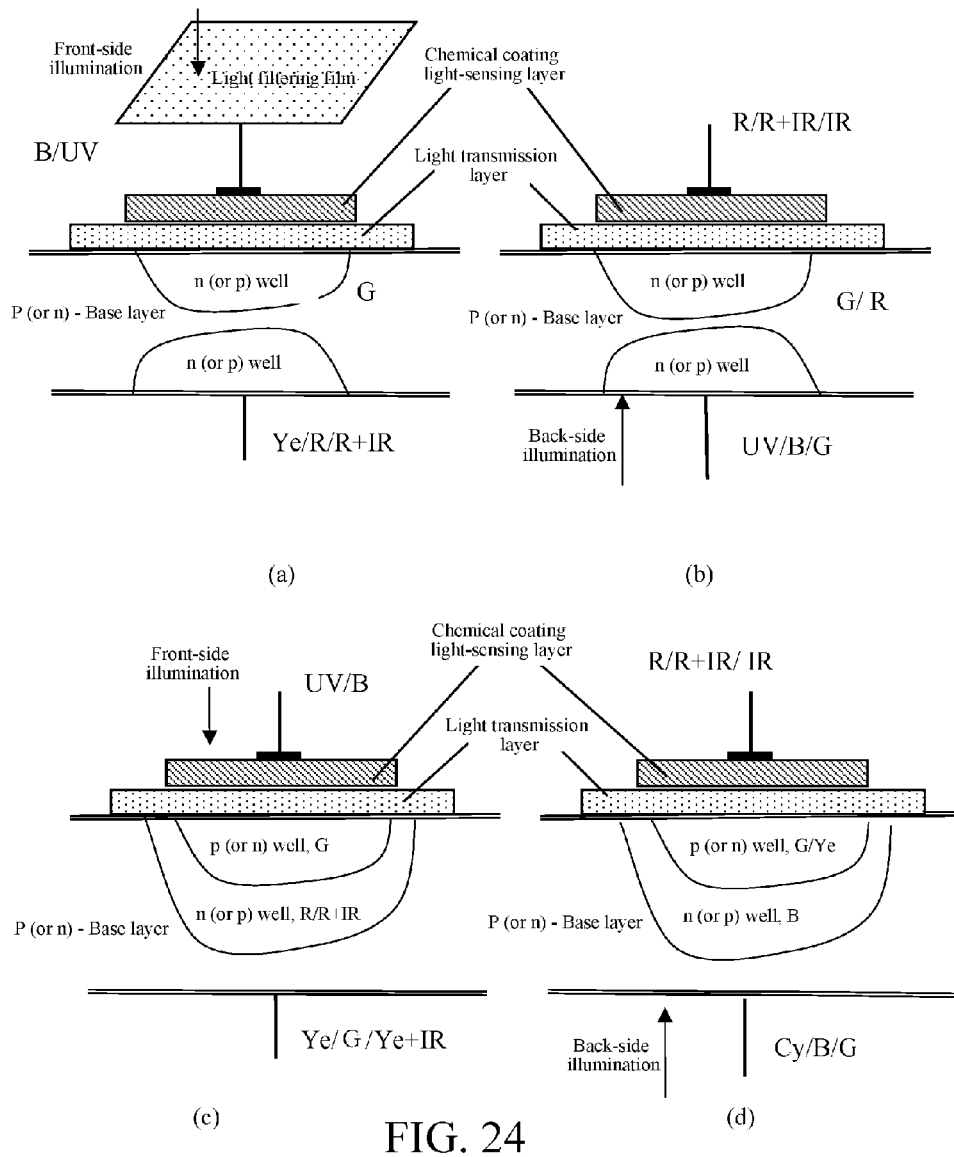
Figure 25:
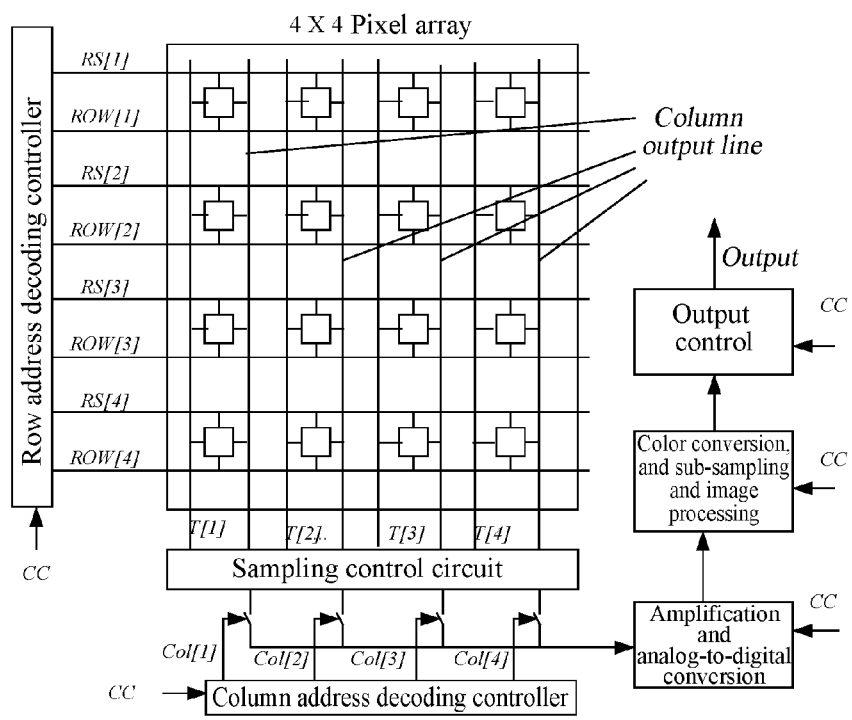

it should be pointed out that, currently a quantum dot material having this ideal red, green, blue, cyan, and yellow wavelength response curve has not been found; so, during implementation of the current light-sensing device for a quantum light-sensing film, a color light filtering film still needs to be adopted; introduction of the color light filtering film causes waste of energy of incident light, so sensitivity of the current light-sensing device for a quantum light-sensing film is theoretically inferior to that of a double-layered light-sensing device without using any color light filtering film proposed by the inventor (such as "multi-spectrum light-sensing device and manufacturing method for same" (PCT/CN2007/071262), "multi-spectrum light-sensing device and manufacturing method for same" (Chinese Application No: 200810217270.2), and "multi-spectrum light-sensing device" (Chinese Application No: 200910105372.X));

FIG. 7 shows a 3T reading circuit for a quantum dot light-sensing pixel, where this circuit is very similar to a conventional semiconductor 3T circuit;

FIG. 8 shows a 4T reading circuit for a quantum dot light-sensing pixel, where this circuit is very similar to a conventional semiconductor 4T circuit;

FIG. 9 shows an implementation method for a multi-layered light-sensing device for a quantum light-sensing film proposed in U.S. Patent application PCT/US2008/060947, where it should be noted that, implementation of a light-sensing device of more than two layers is very difficult, and practices prove that the light-sensing device of more than two layers is not competitive in either cost or performance;

FIG. 10 shows a conventional semiconductor (CMOS and CCD) 4T reading circuit, where this drawing is very similar to FIG. 8; similarity between this type of reading circuits makes a mixed multi-spectrum light-sensing device possible;

FIG. 11 shows a four-point sharing reading circuit proposed by the inventor in "multi-spectrum light-sensing device and sampling method for same" (Chinese Application No: 200910105948.2) and "light-sensing device and reading method for same, and reading circuit" (Chinese Application No: 200910106477.7);

FIG. 12 shows a double-layered six-point sharing reading circuit proposed by the inventor in "multi-spectrum light-sensing device and sampling method for same" (Chinese Application No: 200910105948.2) and "light-sensing device and reading method for same, and reading circuit" (Chinese Application No: 200910106477.7);

FIG. 13 shows a double-layered eight-point sharing reading circuit proposed by the inventor in "multi-spectrum light-sensing device and sampling method for same" (Chinese Application No: 200910105948.2) and "light-sensing device and reading method for same, and reading circuit" (Chinese Application No: 200910106477.7);

FIG. 14 shows an N-point (where N is a random number) sharing reading circuit proposed by the inventor in "light-sensing device and reading method for same, and reading circuit" (Chinese Application No: 200910105948.2);

FIG. 15 is a schematic diagram of a double-sided double-layered multi-spectrum light-sensing device proposed by the inventor in "multi-spectrum light-sensing device and manufacturing method for same" (Chinese Application No: 200810217270.2) and "multi-spectrum light-sensing device" (Chinese Application No: 200910105372.X);

FIG. 16 is a schematic diagram of another double-sided double-layered multi-spectrum light-sensing device proposed by the inventor in "multi-spectrum light-sensing device and manufacturing method for same" (Chinese Application No: 200810217270.2) and "multi-spectrum light-sensing device" (Chinese Application No: 200910105372.X), where this double-sided double-layered multi-spectrum light-sensing device adopts a honeycomb pixel arrangement manner;

FIG. 17 (a) to FIG. 17 (d) are schematic diagrams of a double-layered mixed multi-spectrum light-sensing device proposed in the present invention, where one layer is a light-sensing pixel layer adopting a chemical light-sensing material (such as, quantum light-sensing film), and the other layer is a light-sensing pixel layer adopting a semiconductor light-sensing diode (or light-sensing gate), such as, a CCD or CMOS light-sensing pixel layer; the difference between FIG. 17 (a) as well as FIG. 17 (c) and FIG. 17 (b) as well as FIG. 17 (d) lies in whether a semiconductor light-sensing pixel adopts a BSI (backside illumination) manner or an FSI (frontside illumination) manner;

FIG. 18 is a schematic diagram of a double-layered light-sensing device whose light-sensing pixels of an upper layer and a lower layer are complementary or orthogonal on an interested spectrum proposed by the inventor in "multi-spectrum light-sensing device and manufacturing method for same" (Chinese Application No: 200810217270.2) and "multi-spectrum light-sensing device" (Chinese Application No: 200910105372.X), where enormous excellent double-layered light-sensing devices can be obtained by use of elaborately selected color patterns and arrangements; these light-sensing devices can be used for front-side light-sensing, back-side light-sensing, and bidirectional light-sensing; these methods and principles are also applicable to a mixed multi-spectrum light-sensing device likewise;

FIG. 19 shows a sub-sampling method for implementing charge combining between different color pixels proposed by the inventor in "multi-spectrum light-sensing device and sampling method for same" (Chinese Application No: 200910105948.2), where this method is applicable to a mixed multi-spectrum light-sensing device likewise;

FIG. 20 shows a pixel combining and sub-sampling method implemented by use of color space conversion proposed by the inventor in "multi-spectrum light-sensing device and sampling method for same" (Chinese Application No: 200910105948.2);

FIG. 21 shows a reading circuit for reading a signal of a light-sensing pixel by use of an active pixel and a passive pixel simultaneously proposed by the inventor in "light-sensing device and reading method for same, and reading circuit" (Chinese Application No: 200910106477.7), where benefits of adoption of this method are in that the dynamic range of a light-sensing device can be greatly expanded, and power consumption during image preview is saved exponentially; this mixed reading circuit is particularly useful in a mixed multi-spectrum light-sensing device with high sensitivity;

FIG. 22 shows a selection of a direction by time division implementation manner of a bidirectional light-sensing device proposed by the inventor in "multi-spectrum light-sensing device" (Chinese Application No: 200910105372.X), where this manner is applicable to a mixed multi-spectrum light-sensing device likewise;

FIG. 23 (a) and FIG. 23 (b) are two schematic diagrams of a selection of a direction by a pixel implementation manner of a bidirectional light-sensing device proposed by the inventor in "multi-spectrum light-sensing device" (Chinese Application No: 200910105372.X), where this manner is applicable to a mixed multi-spectrum light-sensing device likewise;

FIG. 24 is a schematic diagram of implementation of a multi-layered light-sensing pixel of a three-layered mixed multi-spectrum light-sensing device, where this implementation adopts a chemical coating light-sensing pixel layer, and two semiconductor pixel layers; it is also possible to sandwich a semiconductor pixel layer by use of two chemical coating light-sensing pixel layers; and FIG. 25 is a schematic diagram of a sampling control circuit used for describing a pixel combining and sub-sampling method proposed in the present invention in "multi-spectrum light-sensing device and sampling method for same" (Chinese Application No: 200910105948; 2), where the present invention also uses this innovative pixel combining and sub-sampling method.

DETAILED DESCRIPTION OF THE EMBODIMENTS

The present invention is further illustrated in detail below through specific implementation manners with reference to accompanying drawings.

The present invention relates to a light-sensing device, and in particular, to design, manufacturing, and system use of a large-array high-performance multi-spectrum light-sensing device. The present invention merges a novel technology for a quantum dot light-sensing film or another possible chemical coating light-sensing pixel and a mature semiconductor light-sensing chip technology, to invent a new mixed light-sensing device and a system thereof, which combine to advantages of a semiconductor (CCD or CMOS) light-sensing device and a chemical coating (such as, quantum film) light-sensing device, so as to obtain a multi-spectrum light-sensing device which achieves or almost achieves the theoretical limit of light use efficiency.

In an implementation manner of the present invention, firstly a mixed multi-spectrum light-sensing pixel group is provided and includes at least one chemical coating light-sensing pixel and at least one semiconductor light-sensing pixel.

In the light-sensing pixel group, at least one chemical coating light-sensing pixel and at least one semiconductor light-sensing pixel can be arranged on a same plane, to form a planar mixed light-sensing pixel.

In an implementation manner of the present invention, a light-sensing pixel group is also provided likewise, and at least one chemical coating light-sensing pixel and at least one semiconductor light-sensing pixel are arranged as an up-and-down structure, to form a layered mixed light-sensing pixel. It should be pointed out that, a manner of firstly describing the chemical coating light-sensing pixel does not limit the chemical coating light-sensing pixel to be located above in the up-and-down structure, while is only required by the writing style; it can be seen from the following that, the up-and-down relationship between the chemical coating light-sensing pixel and the semiconductor light-sensing pixel is not limited, and which one is located above, and which one is located below can be randomly disposed according to needs.

It should be noted that, the up-and-down structure in this text is described with respect to a situation where a light-sensing face of a light-sensing pixel is horizontally placed, and a light source vertically illuminates the light-sensing face from top or bottom. Obviously, the up-and-down structure in this text actually has a wider meaning, namely, if the light-sensing face is vertically placed, and the light source vertically illuminates the light-sensing face from the left side or right side, or from the front side or back side, the so-called up-and-down structure is equivalent to a front-and-back structure or left-and-right structure. In short, here through description about the up-and-down structure, a structure form where a chemical coating light-sensing pixel and a semiconductor light-sensing pixel are disposed in parallel on different layers along a direction is defined. In the following, without loss of generality, layer arrangement relationships between a chemical coating light-sensing pixel and a semiconductor light-sensing pixel are all illustrated with the up-and-down structure, and a person skilled in the art can understand that, description about the upper side and the lower side therein can be equivalently replaced with description about the left side, the right side, the front side, and the back side.

In a mixed light-sensing pixel group in an up-and-down structure, it can be that, the at least one chemical coating light-sensing pixel is arranged above the at least one semiconductor light-sensing pixel. It can also be that, the at least one chemical coating light-sensing pixel is arranged below the at least one semiconductor light-sensing pixel. According to different numbers, multiple possibilities exist for the disposition of the up-and-down location thereof, such as:

the chemical coating light-sensing pixel and the semiconductor light-sensing pixel are each one in number, and the chemical coating light-sensing pixel is arranged above or below the semiconductor light-sensing pixel; or the chemical coating light-sensing pixel and the semiconductor light-sensing pixel are each two in number, one of the two chemical coating light-sensing pixels is arranged above the two semiconductor light-sensing pixels, and the other thereof is arranged below the two semiconductor light-sensing pixels; or one of the two chemical coating light-sensing pixels is arranged above the two semiconductor light-sensing pixels, and the other thereof is arranged between the two semiconductor light-sensing pixels; or one of the two chemical coating light-sensing pixels is arranged below the two semiconductor light-sensing pixels, and the other thereof is arranged between the two semiconductor light-sensing pixels, and so on.

Referring to FIG. 17, a double-layered mixed multi-spectrum light-sensing pixel is implemented and includes a chemical coating light-sensing pixel and a semiconductor light-sensing pixel; the chemical coating light-sensing pixel and the semiconductor light-sensing pixel are arranged in an up-and-down manner. As described above, the chemical coating light-sensing pixel can be placed above or below the semiconductor light-sensing pixel. However, the bandgap of silicon is small, so the semiconductor light-sensing pixel can only induce little near-infrared light, so when infrared is required, the chemical coating light-sensing pixel should be placed below the semiconductor light-sensing pixel (namely, away from the light source).

For a more complex multi-layered mixed multi-spectrum light-sensing pixel, it is further included that, at most two chemical coating light-sensing pixels or semiconductor light-sensing pixels are disposed above, below or between the foregoing chemical coating light-sensing pixel and semiconductor light-sensing pixel. The chemical coating light-sensing pixel can be implemented by use of a quantum coating light-sensing pixel. The semiconductor light-sensing pixel can be implemented by use of a CMOS light-sensing diode, a CMOS light-sensing gate, a CCD light-sensing diode, a CCD light-sensing gate, and a CMOS and CCD light-sensing diode and light-sensing gate having a bidirectional charge transfer function proposed in "light-sensing device and reading method for same, reading circuit" (Chinese Application No: 200910106477.7).

The chemical coating light-sensing pixel or the semiconductor light-sensing pixel can be a front-side light-sensing pixel, a back-side light-sensing pixel, or a bidirectional light-sensing pixel. For example, the semiconductor light-sensing pixel is made into a BSI (backside illumination) structure manner, or an FSI (frontside illumination) structure manner. FIG. 17(b) and FIG. 17(d) show the BSI manner, and FIG. 17(a) and FIG. 17(c) show the FSI manner.

However, when the chemical coating light-sensing pixel or the semiconductor light-sensing pixel is a bidirectional light-sensing pixel, the problem of selecting a direction by light-sensing is concerned, namely, the chemical coating light-sensing pixel or the semiconductor light-sensing pixel can sense light in a bidirectional manner, but the chemical coating light-sensing pixel or the semiconductor light-sensing pixel cannot accept light illumination in two directions at a same moment, and it is required to select light source illumination in a direction at a moment; a manner of selection of a direction by light-sensing can be selection of a direction by isolation, selection of a direction by time division, selection of a direction by area division, or selection of a direction by a pixel, that is to say, selection of a direction by light-sensing according to a moment, according to an area, and according to a pixel can be implemented in a manner of, such as, blocking by use of a light blocking film. FIG. 18 shows a situation of bidirectional illumination, FIG. 22 shows a situation of selection of a direction by time division, and FIG. 23 shows a situation of selection of a direction by a pixel.

In the mixed multi-spectrum light-sensing pixel group, the chemical coating light-sensing pixel and the semiconductor light-sensing pixel appropriately each induce a complementary band or sub-band of ultraviolet, visible light, near-infrared, and far-infrared; or each induce an orthogonal band or a sub-band of ultraviolet, visible light, near-infrared, and far-infrared. Color information included in a band or a sub-band is detailed in the following.

After various mixed multi-spectrum light-sensing pixels are obtained with the foregoing method, a mixed multi-spectrum light-sensing device is manufactured according to FIG. 15, FIG. 16, FIG. 19, and various methods provided in invention applications such as "multi-spectrum light-sensing device and manufacturing method for same"(PCT/CN2007/071262), "multi-spectrum light-sensing device and manufacturing method for same" (Chinese Application No: 200810217270.2), "multi-spectrum light-sensing device" (Chinese Application No: 200910105372.X), "multi-spectrum light-sensing device and sampling method for same" (Chinese Application No: 200910105948.2), and "light-sensing device and reading method for same, and reading circuit" (Chinese Application No: 200910106477.7). The light-sensing device includes at least one chemical coating light-sensing pixel and at least one semiconductor light-sensing pixel.

According to spectrum characteristics and manufacturing convenience performances of the two pixels, preferable locations of the two pixels may be different, and the at least one chemical coating light-sensing pixel and the at least one semiconductor light-sensing pixel can be arranged on a same plane to form a planar mixed-type multi-spectrum light-sensing device, but the following layered mixed-type multi-spectrum light-sensing device is more widely applicable. For example, in an implementation manner, the light-sensing device includes at least two light-sensing pixel layers, the at least one chemical coating light-sensing pixel is arranged at one of the at least two light-sensing pixel layers, and the at least one semiconductor light-sensing pixel is arranged at the other of the at least two light-sensing pixel layers.

The light-sensing pixel layer is roughly equivalent to a light-sensing plane vertical to the illumination direction of the light source, such a light-sensing plane is provided with a plurality of light-sensing pixels (generally formed into a multi-row multi-column pixel array), and each light-sensing pixel layer of a plurality of light-sensing pixel layers may also be in a planar mixed-type, that is, not only provided with a chemical coating light-sensing pixel, but also provided with a semiconductor light-sensing pixel. In another situation, only a light-sensing pixel is arranged in a same light-sensing pixel layer, and in this way, a chemical coating light-sensing pixel layer, or a semiconductor light-sensing pixel layer is formed.

Similarly, a chemical coating light-sensing pixel layer can be arranged above or below a semiconductor light-sensing pixel layer. A light-sensing device can include one or more chemical coating light-sensing pixel layers or one or more semiconductor light-sensing pixel layers. Moreover, pixel arrangement locations of chemical coating light-sensing pixel layers and pixel arrangement locations of semiconductor light-sensing pixel layers are not necessarily one-to-one corresponding; since induction of the chemical coating light-sensing pixel layer and induction of the semiconductor light-sensing pixel layer are not consistent for light of different colors, different types of light-sensing pixel layers (chemical coating light-sensing pixel layer or semiconductor light-sensing pixel layer) may be provided with different numbers of pixels; therefore, a pixel location of a chemical coating light-sensing pixel layer may be not provided with any pixel at a corresponding location on a semiconductor light-sensing pixel layer (namely, a location where light penetrating from the pixel location of the chemical coating light-sensing pixel layer is illuminated onto the semiconductor light-sensing pixel layer), namely, the both are not corresponding, while if the pixel location is also provided with a pixel, it means that the pixel arrangement location of the chemical coating light-sensing pixel layer and the pixel arrangement location of the semiconductor light-sensing pixel layer are corresponding.

In an implementation manner, light-sensing pixels of the light-sensing device at a same location but different layers each induce a complementary band or sub-band of ultraviolet, visible light, near-infrared, and far-infrared; or each induce an orthogonal band or a sub-band of ultraviolet, visible light, near-infrared, and far-infrared. The complementary band or sub-band includes ultraviolet spectrum, blue spectrum, green spectrum, red spectrum, near-infrared spectrum, far-infrared spectrum, cyan spectrum, yellow spectrum, white spectrum, near-infrared spectrum+far-infrared spectrum, red spectrum+near-infrared spectrum, red spectrum+near-infrared spectrum+far-infrared spectrum, yellow spectrum+near-infrared spectrum, yellow spectrum+near-infrared spectrum+far-infrared spectrum, visible spectrum+near-infrared spectrum+far-infrared spectrum, ultraviolet spectrum+visible spectrum, ultraviolet spectrum+visible spectrum+near-infrared spectrum, and ultraviolet spectrum+visible spectrum+near-infrared spectrum+far-infrared spectrum; and the orthogonal band or sub-band includes ultraviolet spectrum, blue spectrum, green spectrum, red spectrum, near-infrared spectrum, far-infrared spectrum, cyan spectrum, yellow spectrum, white spectrum, near-infrared spectrum+far-infrared spectrum, red spectrum+near-infrared spectrum, red spectrum+near-infrared spectrum+far-infrared spectrum, yellow spectrum+near-infrared spectrum, yellow spectrum+near-infrared spectrum+far-infrared spectrum, visible spectrum+near-infrared spectrum+far-infrared spectrum, ultraviolet spectrum+visible spectrum, ultraviolet spectrum+visible spectrum+near-infrared spectrum, and ultraviolet spectrum+visible spectrum+near-infrared spectrum+far-infrared spectrum.

The implementation manner includes a band enabling at least one layer in the mixed multi-spectrum light-sensing device to induce two different spectrums (namely, radio frequency). The color arrangement of a pixel array for each light-sensing pixel layer includes same arrangement (colors of pixels in the pixel array are the same), horizontal arrangement (colors of pixels in the pixel array in a same row are the same), vertical arrangement (colors of pixels in the pixel array in a same column are the same), diagonal arrangement (colors of pixels in the pixel array on a same diagonal are the same), generalized Bayesian arrangement (colors of pixels in the pixel array on a diagonal are the same, and colors of pixels in the pixel array on the other diagonal are different), YUV422 arrangement, transverse YUV422 arrangement, honeycomb arrangement, and uniform arrangement (four pixels are arranged in a uniform, staggered and equidistant manner).

In an embodiment of the present invention, in the light-sensing device, the at least one chemical coating light-sensing pixel or the at least one semiconductor light-sensing pixel is a front-side light-sensing pixel, a back-side light-sensing pixel, or a bidirectional light-sensing pixel. Namely, the mixed multi-spectrum light-sensing device can be used for frontside illumination, back-side illumination, or bidirectional illumination. The situation of the bidirectional illumination is shown in FIG. 18, FIG. 22, and FIG. 23 (*b*).

When the chemical coating light-sensing pixel or the semiconductor light-sensing pixel is a bidirectional light-sensing pixel, namely, when the mixed multi-spectrum light-sensing device is used for bidirectional illumination, a manner of selection of a direction by light-sensing thereof is selection of a direction by isolation, selection of a direction by time division, selection of a direction by area division, or selection of a direction by a pixel. For example, the selection of a direction by time division manner is shown in FIG. 22, and time division light-sensing is performed through turning-on/off of a shutter; the selection of a direction by a pixel manner is shown in FIG. 23 (*a*), and the selection of a direction by a pixel is performed in a film blocking manner.

The chemical coating light-sensing pixel layer and the semiconductor light-sensing pixel layer in the light-sensing device can be arranged on a substrate, or definitely, can also be arranged on different substrates. For example, the chemical coating light-sensing pixel layer is arranged on a substrate, and the semiconductor light-sensing pixel layer is arranged on another substrate.

Figure 1:
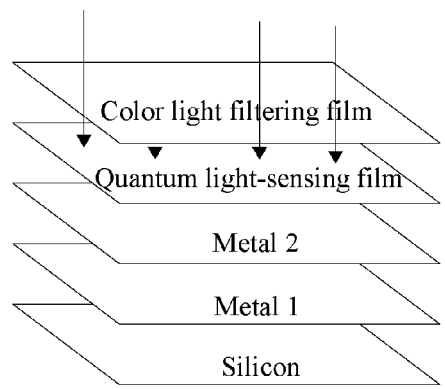
FIG. 1 shows an innovative light-sensing device adopting a quantum light-sensing film described in U.S. Patent application PCT/US2008/060947 invented by InVisage corporation, where it is noted that in this drawing, the quantum light-sensing film is the core of this invention; the quantum light-sensing film is actually one of chemical material light-sensing films, and this material is not unique; with advances of sciences and technologies, a more advanced chemical material light-sensing film will further emerge in future undoubtedly.
Figure 2:
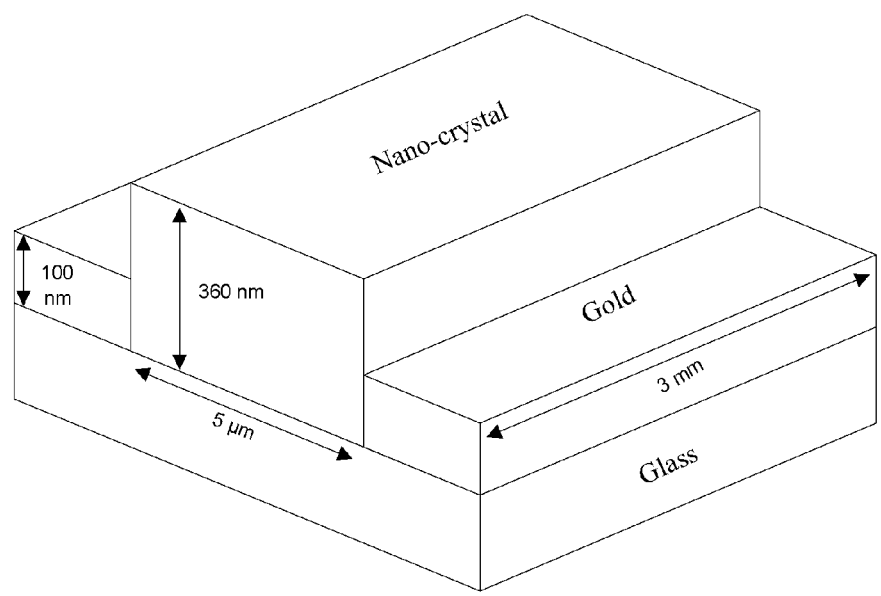
FIG. 2 is a schematic diagram of a pixel structure of a light-sensing device for a quantum light-sensing film, where it is noted that an electrode contacting the quantum light-sensing film uses rear and expensive gold.
Figure 3:
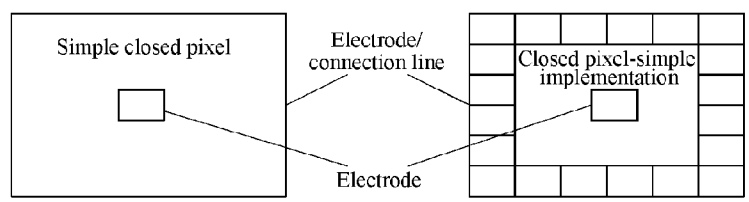
FIG. 3 is a schematic diagram of a structure and an electric connection of a simple closed-type light-sensing pixel made of a quantum dot material.
Figure 4:
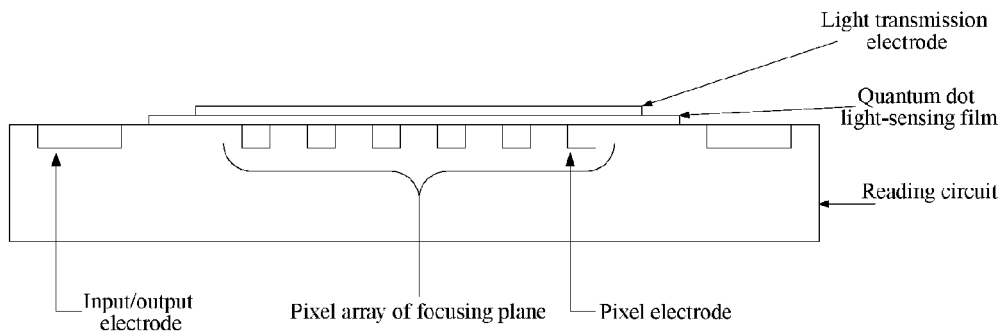
FIG. 4 is a simple schematic diagram of an arrangement of a light-sensing device adopting a (single-layered) quantum light-sensing film on a semiconductor base layer and a device structure, where it is noted that the semiconductor base layer mainly provides a transfer circuit, but does not provide any light-sensing pixel.
Figure 5:
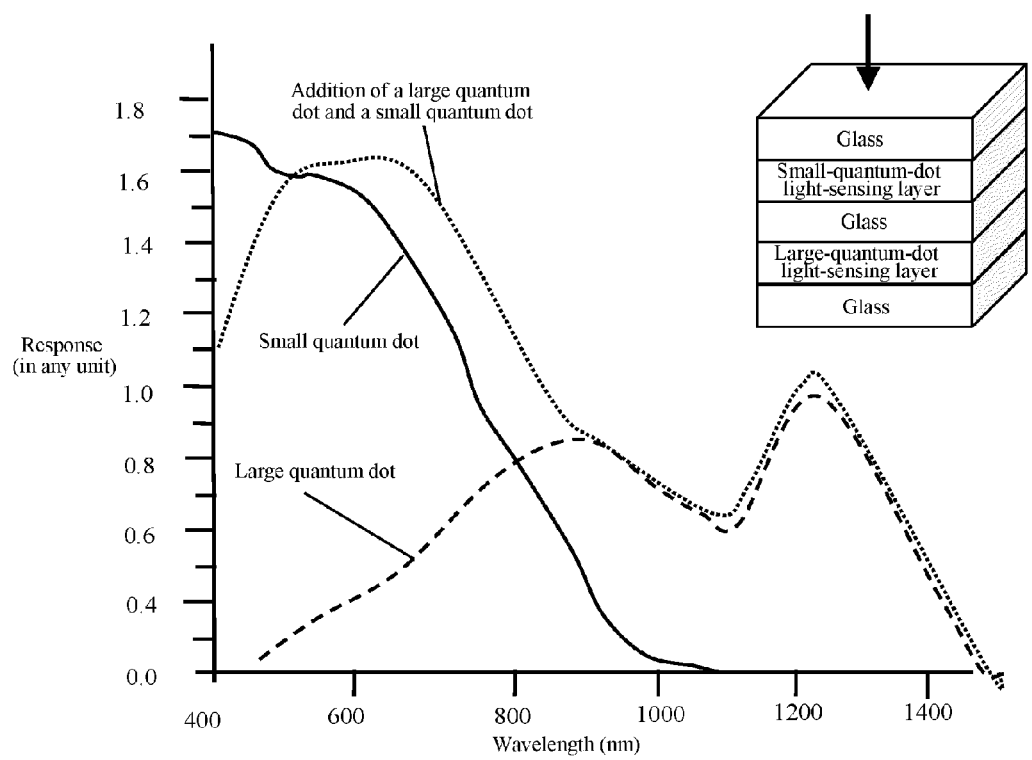
FIG. 5 shows frequency spectrum response curves of several current excellent quantum dot light-sensing materials, where it is noted that, response of a small-sized quantum dot to light with wavelength above 700 nanometers is not good enough, while response of a large-sized quantum dot to light with wavelength below 700 nanometers is not good enough.
Figure 6:
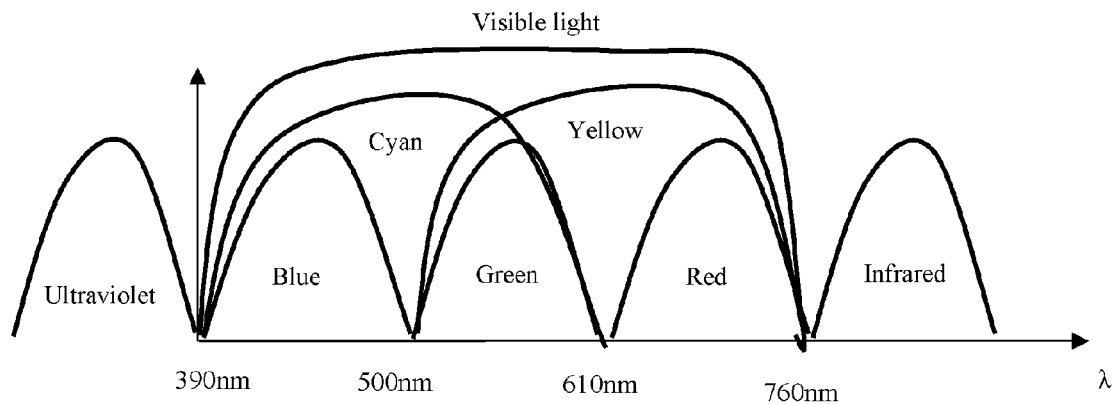
FIG. 6 is a schematic diagram of a spectrum distribution, where visible light generally refers to light with wavelength ranging from 390 nm to 760 nm; generally, for light which is visible after a prism performs light splitting, wavelength of blue light ranges from 440 to 490 nm, wavelength of green light ranges from 520 to 570 nm, wavelength of red light ranges from 630 to 740 nm, while in design for a light-sensing device, generally, an area of 390 to 500 nm is classified as a blue area, an area of 500 to 610 nm is classified as a green area, an area of 610 to 760 nm is classified as a red area, but this division of bands of red, green, and blue is not absolute; wave forms of red, green, blue, cyan, and yellow in the drawing are ideal wavelength response curves required by primary-color light-sensing pixels or complementary-color (composite color) light-sensing pixels, or otherwise it is very difficult to reconstruct an overwhelming majority of colors which are visible to human beings.

It should be noted that, the term "arrangement" or "disposition" in this text, in addition to the meaning of placement on a substrate, further includes various manufacturing techniques for forming a chemical coating light-sensing pixel layer or semiconductor light-sensing pixel layer on a substrate. For example, the substrate is an N-type silicon crystal substrate, at a pixel location on a face of the substrate, according to a color depth demand, P impurities are imbedded from the surface at the pixel location to the inside of the substrate by a certain depth, to form a P doped layer, and the P doped layer is formed into a semiconductor pixel; if N impurities are imbedded at the P doped layer by another certain depth, to form an N doped layer in the P doped layer, and the N doped layer is formed into another semiconductor light-sensing pixel (located at a light-sensing pixel layer different from that at which the semiconductor light-sensing pixel of the previous P doped layer is located, but their pixel locations are corresponding); layered lines can be disposed nearby 390 nm, nearby 500 nm, nearby 610 nm, and nearby 760 nm according to the method provided in "multi-spectrum light-sensing device and manufacturing method for same" (PCT/CN2007/071262), so that pixels at corresponding points above and below any one layered line induce complementary or orthogonal spectrums. FIG. 6 gives an example of disposition of a layered line, namely, different colors are formed by doping impurities at different depths. The face of the substrate is daubed and machined with a chemical coating solution, and a chemical coating light-sensing pixel layer can be formed. Because of diversity of manufacturing or machining techniques, depiction is made with "arrangement" or "disposition" in this text.

The foregoing double-layered semiconductor light-sensing pixel is arranged at different depths, so that a same pixel location on a surface of the substrate can induce at least two bands, thereby providing pixel pattern arrangements on the surface with better flexibility and more pixel arrangements, the sensitivity, the resolution, and the dynamic range of the light-sensing device can be greatly improved.

For the foregoing doping and machining on a face of the semiconductor substrate at different depths, two layers of light-sensing pixels are at most arranged at a same location thereof, the reason is that because if three layers of light-sensing pixels are arranged at a same location, the machining difficulty is great, and simultaneously, for the wire arrangement, because leads between layers need to be isolated from each other, three layers of leads evidently cause the wire arrangement difficult. However, in the present invention, color reconstruction is completed by at most arranging two layers of the foregoing semiconductor light-sensing pixel layers on a same face in combination with the pixel pattern arrangement on a plane, so better color light-sensing performance can be achieved. At most two semiconductor light-sensing pixel layers are arranged on a same face in a depth doping manner, so the difficulty of the three-dimensional machining technique is obviously reduced, and the wire arrangement is also relatively simple.

In an implementation manner, for the substrate, a single-sided or double-sided machining technique can be adopted, thereby forming a single-sided light-sensing device or double-sided light-sensing device. In the double-sided light-sensing device, for the foregoing depth doping machining, if a double-sided arrangement manner where one of two semiconductor light-sensing pixel layers is arranged on the top of the substrate, and the other thereof is arranged on the bottom of the substrate is adopted, for each face, the machining technique is simplified into a plane machining technique, after plane machining on a light-sensing pixel layer is completed on a face, the substrate is overturned, and on another face likewise, machining on another light-sensing pixel layer is completed with a plane machining technique, so that the machining technique is similar to the existing machining technique for a single-sided single-layered light-sensing device, and is simpler relative to the foregoing three-dimensional machining for double-layered doping on a same face. In another aspect, multiple layers of light-sensing pixels can be arranged at a location of the substrate along the light illumination direction, and in the following, two faces of the substrate are referred to as top and bottom. As described above, the description likewise takes that the substrate is horizontally placed and the light source is incident vertically from the top or bottom as a reference. A person skilled in the art can understand that, when the substrate is placed in another manner, possible equivalent replacement description includes the left side face and the right side face, or the front side face and the back side face.

The mixing of the chemical coating light-sensing pixel layer and the semiconductor light-sensing pixel layer greatly reduces the machining difficulty of the double-layered or multi-layered light-sensing device while further improving the performance of the double-layered or multi-layered light-sensing device. The machining convenience thereof is matchless when compared with that of a pure double-layered or multi-layered chemical coating light-sensing device or pure double-layered or multi-layered semiconductor light-sensing device.

In combination with the single-sided or double-sided and multi-layered arrangement at a same pixel location, diversified forms of light-sensing devices can be formed, which for example include:

a single-sided double-layered light-sensing device, including a chemical coating light-sensing pixel layer and a semiconductor light-sensing pixel layer, and the chemical coating light-sensing pixel layer and the semiconductor light-sensing pixel layer are arranged at the top or bottom of the substrate; or a double-sided double-layered light-sensing device, including a chemical coating light-sensing pixel layer and a semiconductor light-sensing pixel layer, the chemical coating light-sensing pixel layer is arranged at the top or bottom of the substrate, and the semiconductor light-sensing pixel layer is arranged at the bottom or top of the substrate; or a double-sided three-layered light-sensing device, including a chemical coating light-sensing pixel layer and two semiconductor light-sensing pixel layers, the chemical coating light-sensing pixel layer is arranged at the top or bottom of the substrate, and the two semiconductor light-sensing pixel layers are arranged at the bottom or top of the substrate; or one of the two semiconductor light-sensing pixel layers is arranged at the top of the substrate, and the other thereof is arranged at the bottom of the substrate; or a double-sided four-layered light-sensing device, including two chemical coating light-sensing pixel layers and two semiconductor light-sensing pixel layers, the two semiconductor light-sensing pixel layers are arranged at the bottom or top of the substrate, one of the two chemical coating light-sensing pixel layers is arranged above the top, and the other thereof is arranged below the bottom; or the two chemical coating light-sensing pixel layers are arranged at the top or bottom of the substrate, one of the two semiconductor light-sensing pixel layers is arranged above the top, and the other thereof is arranged below the bottom; and so on.

FIG. 24 shows an implementation manner of a three-layered light-sensing pixel of a three-layered mixed multi-spectrum light-sensing device, where FIG. 24 (a) and FIG. 24 (b) show a double-sided three-layered light-sensing device, FIG. 24 (c) and FIG. 24 (d) show a single-sided three-layered device, and in the implementation, a chemical coating light-sensing pixel layer and two semiconductor light-sensing pixel layers are used. Similarly, two chemical coating light-sensing pixel layers and a semiconductor light-sensing pixel layer can also be used, and the semiconductor light-sensing pixel layer is sandwiched the two chemical coating light-sensing pixel layers. Other light-sensing devices such as a four-layered mixed multi-spectrum light-sensing device can also be implemented with reference to the manner of this drawing.

Furthermore, it can be arranged that a light-sensing pixel closer to the light source induces light with a shorter wavelength, namely, a light-sensing pixel layer inducing light with a shorter wavelength is a light-sensing pixel layer closer to the light source, as shown in FIG. 9.

For example, if the light source illuminates from the top, the substrate is disposed with a blue light-sensing pixel layer, a green light-sensing pixel layer, a red light-sensing pixel layer, and an infrared pixel light-sensing pixel layer sequentially from the top to the bottom. An implementation situation is as follows, three layers of semiconductor light-sensing pixel layers are disposed, and the three layers of semiconductor light-sensing pixel layers are arranged on the substrate in a manner of manufacturing a layer on a face of the substrate and manufacturing two layers on another face, so as to respectively induce the blue light, the green light, and the red light belonging to visible light. A chemical coating light-sensing pixel layer is arranged below the bottom of the substrate and used for inducing infrared. This is the double-sided four-layered light-sensing device, so induction spectrums of pixels between different layers are designed to make the induction spectrums orthogonal in pairs, and if the total sum of induction spectrums of pixels of all layers covers the entire interested spectrum, energy of incident light can be maximally used, and the machining difficulty is not increased much.

In many applications, the front side, the back side, or the two sides of the chemical coating light-sensing pixel layer or semiconductor light-sensing pixel layer is not coated with any light filtering film. However, in some other applications, such as a professional camera or camcorder with a particularly high color restoration requirement, the implementation manner includes a manner of using a light filtering film. The light filtering films are disposed on a light-sensing pixel layer closest to the light source, or disposed on a light-sensing pixel layer farthest from the light source, or disposed between two light-sensing pixel layers, or disposed on a light-sensing pixel layer closest to the light source and a light-sensing pixel layer farthest from the light source; namely, the front side, the back side, or the two sides of the chemical coating light-sensing pixel layer or semiconductor light-sensing pixel layer is coated with a particular light filtering film. Frequency selection characteristics of the light filtering film include infrared cut-off filtering, blue band-pass, green band-pass, red band-pass, cyan band-pass, yellow band-pass, pinkish red band-pass, cyan plus infrared band-pass, yellow plus infrared band-pass, pinkish red plus infrared band-pass, or visible light band-pass. The light filtering film is used to: by sacrificing sensitivity of a minority of pixels, remove affects of undesired spectrums, reduce crosstalk between upper, lower, left and right pixels, or obtain signals of three-primary colors with better orthogonality or purer complementary colors.

The implementation manner includes: enabling two neighboring layers of multiple light-sensing pixel layers of the mixed multi-spectrum light-sensing device to use their respective reading circuits.

The implementation manner includes: enabling two neighboring layers of multiple light-sensing pixel layers of the mixed multi-spectrum light-sensing device to share a reading circuit placed at one of the two neighboring layers.

The implementation manner includes: enabling a reading circuit of the mixed multi-spectrum light-sensing device to be located at a semiconductor light-sensing pixel layer, or at an independent reading circuit layer.

The implementation manner for a reading circuit of the mixed multi-spectrum light-sensing device includes: adopting a pixel reading and sub-sampling method in "multi-spectrum light-sensing device and sampling method for same" (Chinese Application No: 200910105948.2) and "light-sensing device and reading method for same, and reading circuit" (Chinese Application No: 200910106477.7).

The implementation manner includes: adopting a reading circuit for an active pixel, a reading circuit for a passive pixel, or a mixed reading circuit for an active pixel and a passive pixel in a signal reading circuit of the mixed multi-spectrum light-sensing device. The mixed reading circuit for an active pixel and a passive pixel is shown in FIG. 21.

The active pixel includes an active pixel 3T, 4T, 5T or 6T. The structure of the active pixel 3T and the structure of the active pixel 4T are respectively shown in FIG. 7 and FIG. 8.

The sharing manner of the reading circuit includes a no-sharing manner, a single-layered or upper-and-lower-layer 4-point sharing manner, a single-layered or upper-and-lower-layer 6-point sharing manner, a single-layered or upper-and-lower-layer 8-point sharing manner, or a single-layered or upper-and-lower-layer any-number-of-point sharing manner. The 4-point sharing manner, the 6-point sharing manner, the 8-point sharing manner, and the any-number-of-point sharing manner are respectively shown in FIG. 11, FIG. 12, FIG. 13, and FIG. 14.

In an implementation manner, the reading circuit of the mixed multi-spectrum light-sensing device includes a first combining unit configured to perform pair-wise combining and sampling on proximate same-row different-column, different-row same-column, or different-row different-column pixels in a pixel array of each light-sensing pixel layer, to obtain sampling data of a first combining pixel; and a second combining unit configured to perform combining and sampling on the sampling data of the first combining pixel obtained by the first combining unit to obtain sampling data of a second combining pixel.

The implementation manner further includes that: the reading circuit further includes a third combining unit, configured to perform combining and sampling on the sampling data of the second combining pixel obtained by the second combining unit to obtain sampling data of a third combining pixel.

In an embodiment of the present invention, in the light-sensing device, a pixel combining manner of the first combining unit or the second combining unit is a charge addition manner between same or different color pixels or a signal average manner between different color pixels, where the pixel combining manner between different color pixels conforms to a manner of color space conversion, so as to satisfy a color reconstruction requirement.

The foregoing first combining pixel and second combining pixel are derived from processing of at least dividing sub-sampling into two procedures, namely, a first combining and sampling procedure and a second combining and sampling procedure. The first combining and sampling procedure and the second combining and sampling procedure generally occur between pixel row (combining) sampling and column (combining) sampling, are mainly performed on an analog signal, and except that the charge addition part is only performed in the first combining and sampling procedure generally, the sequence and content thereof generally can be exchanged. Furthermore, a third combining and sampling procedure can also be included, and the third combining and sampling procedure occurs after analog-to-digital conversion, and is mainly performed on a digital signal.

For the first combining and sampling procedure, two proximate pixels in the pixel array are taken and combined. In an aspect, combination of the proximate pixels is completed, and pixels after being combined are referred to as a first combining pixel. It should be understood that, the first combining pixel is only for the convenience of describing the present invention, the concept is utilized to refer to the pixel after the first combining procedure, which does not represents that, a "first combining pixel" exists in the pixel array physically; data obtained after the two proximate pixels are combined and sampled is referred to as sampling data of the first combining pixel. Being proximate refers to that two pixels are tightly adjacent between each other when seen from a horizontal, vertical, or diagonal direction, and no other pixel exists between the two pixels. The proximate situation includes same-row different-column, different-row same-column, or different-row different-column. Generally, in this combination, a signal at least is a signal average of two pixels, while noise is reduced by a multiple of $\sqrt{N}$, so after the combination, the signal-to-noise ratio can at least be increased by a multiple of $\sqrt{N}$, and this combination can be performed between pixels in a same color or different colors. In another aspect, two combining colors can be different, namely, colors are added or averaged, so it may be known from the three primary-color principle of colors that, addition of two primary colors is a complementary color of another primary color, that is to say, pixels in two different primary colors are combined to generate a complementary color of another primary color, a primary-color space is converted into a complementary-color space, color space conversion merely occurs, and color reconstruction can still be completed through different complementary colors. Namely, through this manner, pixels in different colors can be combined to improve the signal-to-noise ratio, and simultaneously color reconstruction can also be performed. The entire sub-sampling procedure is also therefore optimized, so as to be more adaptive to high-speed demands of a pixel array of a large data amount. A basic requirement of the color space conversion is as follows, combination of colors after conversion can reconstruct a required RGB (or YUV, or CYMK) color (through a means such as interpolation).

It should be understood that, generally a pixel array includes a plurality of pixels, and the first combining and sampling only combines two pixels, so evidently, there is also a plurality of first combining pixels formed through combination. Color combining manners adopted for different first combining pixels can be the same or different. When the first combining is all performed between same colors, it is referred to as a same-color combining manner; when the first combining is all performed between different colors, it is referred to as a different-color combining manner; when part of the first combining is performed between same colors, and part thereof is performed between different colors, it is referred to as a hybrid combining manner; when some surplus colors in a pixel array are abandoned (definitely, abandonment is selective, for example, color reconstruction cannot be affected due to this), such color combining manner is referred to as a manner of selectively abandoning surplus colors.

Evidently, the second combining procedure is an operation performed on a plurality of first combining pixels, and likewise, first combining pixels in the same color can be combined; first combining pixels in different colors can also be combined (definitely, under this situation, it may be caused that even if three primary colors are all added, no color can be reconstructed).

The foregoing same-color combining manner, different-color combining manner, and hybrid combining manner are to perform color based classification on combining and sampling, and additionally, from the perspective of location selection of combining and sampling, combining and sampling manners of the first combining procedure and the second combining procedure include: an automatic average manner for a signal directly output to a bus, a row-skipping or column-skipping manner, and a one-by-one sampling manner, and simultaneous use of two or three of these manners. Except that the charge addition part can be only performed in the first combining and sampling procedure generally, manners of the first combining procedure and the second combining procedure are the same and can be exchanged except that their sequences are different.

The so-called automatic average manner for a signal directly output to a bus is to simultaneously output signals needing to be combined (whose colors are the same or different) to a data collection bus to obtain an average value of the signals needing to be combined through automatic balance of (voltage) signals. The so-called row-skipping or column-skipping manner is to skip some rows or columns, thereby implementing (combining) sampling in a manner of reducing the data amount. The so-called one-by-one sampling manner actually is to perform no combination, and read the original pixel or the first combining pixel accordingly. Some of these three manners can be used simultaneously. For example, the row-skipping or column-skipping manner and the automatic average manner for a signal directly output to a bus or the one-by-one sampling manner may be used simultaneously.

The sub-sampling manner of the third combining and sampling procedure includes a color space conversion manner, a backend digital image zoom manner, and serial use of these two manners. The first combining procedure and the second combining procedure are mainly performed on an analog signal, while the third sub-sampling procedure is mainly performed on a digital signal, namely, performed after analog-to-digital conversion. Three or four color pixels located at different space locations as values on a same point are converted into another color space, and data may be reduced in the horizontal and (or) vertical directions, thereby achieving the sub-sampling effect. However, the digital image zoom manner is the most straightforward and frequently-used sub-sampling manner.

Charges can be added during combining and sampling. The current combining and sampling almost only achieve averaging of voltage or current signals, and when N points are combined, this manner at most can only increase the signal-to-noise ratio by a multiple of $\sqrt{N}$. The reason lies in that the existing combining and sampling are to perform combining and sampling in a manner where N pixels in the same color share an output line, and on this output line, voltage or current signals of each pixel are inevitably (automatically) averaged, so the increase of the signal-to-noise ratio only lies in that the noise is reduced by a multiple of $\sqrt{N}$ after the combination, thereby increasing the signal-to-noise ratio at most by a multiple of $\sqrt{N}$. However, by means of the charge addition manner of the present invention, for example, a reading capacitor stores charges, to accumulate the charges, so that signals can be superimposed and therefore the signal-to-noise ratio can be increased at least by a multiple of N, which is higher than the signal averaging method at least by a multiple of $\sqrt{N}$. That is to say, N signals are combined with the charge addition method, and an effect of averaging $N^2$ signals at most theoretically or a better effect (as described below) can be achieved, which is a means of increasing the signal-to-noise ratio whose effect is very prominent.

Addition of proximate pixels further brings another prominent effect, that is, the effect of cross-talking between pixels is weakened. The reason lies in that, colors originally interfering with each other is a legal whole now, that is to say, a part of signals which originally belong to noise becomes an effective signal part now, so addition of charges of N signals increases the signal-to-noise ratio, which can approximate to the theoretical upper limit, namely, a multiple of $N\sqrt{N}$, which is thereby equivalent to an effect of averaging $N^3$ signals.

During total-graph sampling (namely, an image is sampled according to the highest resolution), a line-by-line scanning and interleaving or cross-line reading manner can be adopted, the clock speed does not need to be increased, no frame buffer needs to be adopted, and the total-graph frame reading rate of a large-array image is doubled when a single picture is shot. If an AD converter and a row buffer are added, the total-graph frame reading rate can further be increased. This method has a very important value for leaving out a mechanical shutter.

It is noted that, the line-by-line scanning and interleaving or cross-line reading manner of the present invention is different from the field scanning manner (interleaved scanning) in a conventional television system. The conventional field scanning manner is interleaving scanning and interleaving reading, so a field of an odd number and a field of an even number (no matter whether it is light-sensing or reading) are in a difference of a field in the time, namely, half frame. However, in the line-by-line scanning and interleaving or cross-line reading manner of the present invention, a pixel is completely the same as that in the line-by-line scanning and line-by-line reading manner in the light-sensing time sequence, and only the row reading sequence is changed. For detailed description, refer to "multi-spectrum light-sensing device and sampling method for same" (Chinese Application No: 200910105948.2) and "light-sensing device and reading method for same, and reading circuit" (Chinese Application No: 200910106477.7).

In an embodiment of the present invention, in the light-sensing device, the color space conversion includes space conversion from RGB to CyYeMgX, space conversion from RGB to YUV, or space conversion from CyYeMgX to YUV, where X is any one of R (red), G (green), and B (blue).

The implementation manner includes that: the charge addition manner is completed by directly connecting pixels in parallel or simultaneously transferring charges into a reading capacitor (FD).

As described above, in the mixed multi-spectrum light-sensing device, a color based combining and sampling manner of the first combining unit or the second combining unit includes a same-color combining manner, a different-color combining manner, a hybrid combining manner, or a combining manner of selectively abandoning surplus colors, and the combining and sampling manner adopted by the first combining unit and the combining and sampling manner adopted by the second combining unit are not the same-color combining manner simultaneously, namely, at least one of the two combining units does not adopt the same-color combining manner.

As described above, a location based combining and sampling manner of the first combining unit or the second combining unit includes at least one of the following several manners: an automatic average manner for a signal directly output to a bus, a row-skipping or column-skipping manner, and a one-by-one sampling manner. Namely, these several location based combining and sampling manners can be individually used, or combined and used.

As described above, in the mixed multi-spectrum light-sensing device, at least one of the color space conversion manner and the backend digital image zoom manner can be used to implement the combining and sampling manner of the third combining and sampling unit.

FIG. 19 shows a different-color pixel charge combining manner.

The foregoing sub-sampling function is implemented by a row address decoding controller and a column address decoding controller shown in FIG. 25. The row address decoding controller outputs two types of signals: a row selection signal Row[i] (a line at each row) and a row control vector signal RS[i] (one or more lines at each row), where i is the mark of a row. Similarly, the column address decoding controller outputs two types of signals: a column selection signal Col[j] (a line at each column) and a column control vector signal T[j] (one or more lines at each column), where j is the mark of a column.

The row selection signal Row[i] is used for selecting a row, while the column selection signal Col[j] is used for selecting a column. They are two groups of relatively standard signals. The row control vector signal RS[i] is extension on the existing CMOS row control signal (a line at each row is extended to multiple lines at each row), while the column control vector signal T[j] does not exist in some CMOS light-sensing devices at all, and even if the column control vector signal T[j] exists in a CMOS light-sensing devices, a column only has one column control vector signal.

RS[i] and T[j] are used for controlling reset of a light-sensing pixel, zero clearing, light-sensing time, charge transfer, pixel combining, and pixel reading. Because of symmetry between rows and columns, RS[i] and T[j] have many specific implementation manners. The specific implementation manners of these signals are not limited.

As described above, the total-graph sampling manner of the multi-spectrum light-sensing device includes the line-by-line scanning and line-by-line reading manner, or the line-by-line scanning and interleaving or cross-line reading manner.

The implementation manner further includes: manufacturing a light-sensing system, including at least one mixed multi-spectrum light-sensing device.

The light-sensing system is configured to obtain a front-side, back-side, or bidirectional image.

The light-sensing system includes a digital camera, a camera mobile phone, a camcorder, a video or camera monitoring system, an image identifying system, a medical image system, a military, fire fighting, and underground image system, an automatic tracking system, a three-dimensional image system, a machine vision system, an automobile vision or driving assistance system, an electronic game system, a network camera, an infrared and night view system, a multi-spectrum imaging system, and a computer camera.

This mixed multi-spectrum light-sensing device of the present invention may simultaneously obtain numerous color signals and other spectrum signals. For example, in a double-sided four-layered light-sensing device, a semiconductor light-sensing pixel layer is arranged at each of the top and the bottom of a substrate, where the top is used for sensing blue light, green light, or cyan light, and the bottom is used for sensing red light, yellow light, or green light; then a chemical coating light-sensing pixel layer inducing ultraviolet light is arranged on the top semiconductor light-sensing pixel layer, a chemical coating light-sensing pixel layer inducing infrared light is arranged under the bottom semiconductor light-sensing pixel layer, energy of incident light may almost be maximally utilized, so as to obtain information of the full spectrum while obtaining colors, thereby exploiting characteristics of different light-sensing materials to the full. The manufacturing difficulty of such a double-sided four-layered multi-spectrum light-sensing device is not much different from that of a double-sided double-layered multi-spectrum semiconductor light-sensing device. If the advanced sampling and the sub-sampling circuit and method prominently characterized by charge combination and color conversion invented by the inventor previously in the above text are combined and adopted, the complexity of the light-sensing device and system can be greatly reduced further, thereby providing enormous convenience and excellent performance to various applications.

The mixed multi-spectrum light-sensing device can be used for front-side light-sensing, back-side light-sensing, or bidirectional light-sensing. By elaborately arranging a pixel induction spectrum band of a light-sensing device of each layer and reasonable deployment of a color pattern of each layer, various preferable multi-spectrum light-sensing devices can be generated, such as, a high-sensitivity color light-sensing device, a high-sensitivity color and infrared light-sensing device, a high-sensitivity color or multi-spectrum light-sensing device without any mixed color (a mixed color is caused through interpolation), and the like.

By means of a combination of reading of an active pixel and reading of a passive pixel, a light-sensing device with super-low power consumption, and a light-sensing device with a super-high dynamic range can be obtained.

Though the present invention has been disclosed above by the specific embodiments, they are not intended to limit the present invention. Anybody of ordinary skill in the art can make some modifications and variations without departing from the spirit and scope of the present invention. Therefore, the protection scope of the present invention falls within the appended claims.

What is claimed is:

1. A mixed multi-spectrum light-sensing device, comprising at least two light-sensing pixel layers, wherein the light-sensing pixel layers each comprise a chemical coating light-sensing pixel layer and a semiconductor light-sensing layer, at least one chemical coating light-sensing pixel is arranged at the chemical coating light-sensing pixel layer and at least one semiconductor light-sensing pixel is arranged at the semiconductor light-sensing pixel layer;

wherein the at least one chemical coating light-sensing pixel layer is arranged above the at least one semiconductor light-sensing pixel layer; or, wherein the at least one chemical coating light-sensing pixel layer is arranged below the at least one semiconductor light-sensing pixel layer;

wherein two neighboring layers of the light-sensing pixel layers are each provided with a reading circuit; or two neighboring layers of the light-sensing pixel layers share a reading circuit, wherein the reading circuit is a reading circuit for an active pixel, a reading circuit for a passive pixel, or a mixed reading circuit for an active pixel and a passive pixel, wherein a sharing manner of the reading circuit comprises a single-layered or upper-and-lower-layer 4-point sharing manner, a single-layered or upper-and-lower-layer 6-point sharing manner, a single-layered or upper-and-lower-layer 8-point sharing manner, or a single-layered or upper-and-lower-layer any-number-of-point sharing manner;

wherein the reading circuit comprises a first combining unit configured to perform pair-wise combining and sampling on proximate same-row different-column, different-row same-column, or different-row different-column pixels in a pixel array of each light-sensing pixel layer, to obtain sampling data of a first combining pixel; and a second combining unit configured to perform combining and sampling on the sampling data of the first combining pixel obtained by the first combining unit to obtain sampling data of a second combining pixel, wherein a pixel combining manner of the first combining unit or the second combining unit is a charge addition manner between same or different color pixels or a signal average manner between different color pixels, wherein the pixel combining manner between different color pixels conforms to a manner of color space conversion, so as to satisfy a color reconstruction requirement.

2. The light-sensing device according to claim 1, wherein a pixel arrangement location of the at least one chemical coating light-sensing pixel layer and a pixel arrangement location of the at least one semiconductor light-sensing pixel layer are corresponding, wherein light-sensing pixels at a same location but different layers each induce a complementary band or sub-band of ultraviolet, visible light, near-infrared, and far-infrared; or each induce an orthogonal band or a sub-band of ultraviolet, visible light, near-infrared, and far-infrared.

3. The light-sensing device according to claim 2, wherein the complementary band or sub-band comprises ultraviolet spectrum, blue spectrum, green spectrum, red spectrum, near-infrared spectrum, far-infrared spectrum, cyan spectrum, yellow spectrum, white spectrum, near-infrared spectrum+far-infrared spectrum, red spectrum+near-infrared spectrum, red spectrum+near-infrared spectrum+far-infrared spectrum, yellow spectrum+near-infrared spectrum, yellow spectrum+near-infrared spectrum+far-infrared spectrum, visible spectrum+near-infrared spectrum+far-infrared spectrum, ultraviolet spectrum+visible spectrum, ultraviolet spectrum+ visible spectrum+near-infrared spectrum, and ultraviolet spectrum+visible spectrum+near-infrared spectrum+far-infrared spectrum; and the orthogonal band or sub-band comprises ultraviolet spectrum, blue spectrum, green spectrum, red spectrum, near-infrared spectrum, far-infrared spectrum, cyan spectrum, yellow spectrum, white spectrum, near-infrared spectrum+far-infrared spectrum, red spectrum+near-infrared spectrum, red spectrum+near-infrared spectrum+far-infrared spectrum, yellow spectrum+near-infrared spectrum, yellow spectrum+near-infrared spectrum+far-infrared spectrum, visible spectrum+near-infrared spectrum+far-infrared spectrum, ultraviolet spectrum+visible spectrum, ultraviolet spectrum+visible spectrum+near-infrared spectrum, and ultraviolet spectrum+visible spectrum+near-infrared spectrum+far-infrared spectrum.

4. The light-sensing device according to claim 1, wherein the at least one chemical coating light-sensing pixel or the at least one semiconductor light-sensing pixel is a front-side light-sensing pixel, a back-side light-sensing pixel, or a bidirectional light-sensing pixel, wherein when the chemical coating light-sensing pixel or the semiconductor light-sensing pixel is a bidirectional light-sensing pixel, a manner of selection of a direction by light-sensing thereof is selection of a direction by isolation, selection of a direction by time division, selection of a direction by area division, or selection of a direction by a pixel.

5. The light-sensing device according to claim 1, wherein the at least one chemical coating light-sensing pixel layer and the at least one semiconductor light-sensing pixel layer are disposed on a substrate, comprising:

the light-sensing device is a single-sided double-layered light-sensing device, comprising a chemical coating light-sensing pixel layer and a semiconductor light-sensing pixel layer, and the chemical coating light-sensing pixel layer and the semiconductor light-sensing pixel layer are arranged at the top or bottom of the substrate; or the light-sensing device is a double-sided double-layered light-sensing device, comprising a chemical coating light-sensing pixel layer and a semiconductor light-sensing pixel layer, the chemical coating light-sensing pixel layer is arranged at the top or bottom of the substrate, and the semiconductor light-sensing pixel layer is arranged at the bottom or top of the substrate; or the light-sensing device is a single-sided three-layered light-sensing device, comprising a chemical coating light-sensing pixel layer and two semiconductor light-sensing pixel layers, and the chemical coating light-sensing pixel layer and the two semiconductor light-sensing pixel layers are arranged at the top or bottom of the substrate; or the light-sensing device is a double-sided three-layered light-sensing device, comprising a chemical coating light-sensing pixel layer and two semiconductor light-sensing pixel layers, the chemical coating light-sensing pixel layer is arranged at the top or bottom of the substrate, and the two semiconductor light-sensing pixel layers are arranged at the bottom or top of the substrate; or one of the two semiconductor light-sensing pixel layers is arranged at the top of the substrate, and the other thereof is arranged at the bottom of the substrate; or the light-sensing device is a double-sided three-layered light-sensing device, comprising two chemical coating light-sensing pixel layers and a semiconductor light-sensing pixel layer, one of the two chemical coating light-sensing pixel layers is arranged at the top of the substrate, the other thereof is arranged at the bottom of the substrate, and the semiconductor light-sensing pixel layer is arranged at the top or bottom of the substrate; or the light-sensing device is a double-sided four-layered light-sensing device, comprising two chemical coating light-sensing pixel layers and two semiconductor light-sensing pixel layers, the two semiconductor light-sensing pixel layers are arranged at the bottom or top of the substrate, one of the two chemical coating light-sensing pixel layers is arranged above the top, and the other thereof is arranged below the bottom; or the two chemical coating light-sensing pixel layers are arranged at the top or bottom of the substrate, one of the two semiconductor light-sensing pixel layers is arranged above the top, and the other thereof is arranged below the bottom; or the light-sensing device is a double-sided four-layered light-sensing device, comprising a chemical coating light-sensing pixel layer and three semiconductor light-sensing pixel layers, the chemical coating light-sensing pixel layer is arranged at the top or bottom of the substrate, one of the three semiconductor light-sensing pixel layers is arranged at the top or bottom of the substrate, and the other two thereof are arranged at the bottom or top of the substrate; or the light-sensing device is a double-sided five-layered light-sensing device, comprising two chemical coating light-sensing pixel layers and three semiconductor light-sensing pixel layers, one of the two chemical coating light-sensing pixel layers is arranged at the top of the substrate, the other thereof is arranged at the bottom of the substrate, one of the three semiconductor light-sensing pixel layers is arranged at the top or bottom of the substrate, and the other two thereof are arranged at the bottom or top of the substrate; or the light-sensing device is a double-sided six-layered light-sensing device, comprising two chemical coating light-sensing pixel layers and four semiconductor light-sensing pixel layers, one of the two chemical coating light-sensing pixel layers is arranged at the top of the substrate, the other thereof is arranged at the bottom of the substrate, two of the four semiconductor light-sensing pixel layers are arranged at the top of the substrate, and the other two thereof are arranged at the bottom of the substrate.

6. The light-sensing device according to claim 5, wherein a light-sensing pixel layer inducing light with a shorter wavelength is a light-sensing pixel layer closer to a light source.

7. The light-sensing device according to claim 6, further comprising light filtering films, wherein the light filtering films are disposed on a light-sensing pixel layer closest to the light source, or disposed on a light-sensing pixel layer farthest from the light source, or disposed between two light-sensing pixel layers, or disposed on a light-sensing pixel layer closest to the light source and a light-sensing pixel layer farthest from the light source; frequency selection characteristics of the light filtering film comprise infrared cut-off filtering, blue band-pass, green band-pass, red band-pass, cyan band-pass, yellow band-pass, pinkish red band-pass, cyan plus infrared band-pass, yellow plus infrared band-pass, pinkish red plus infrared band-pass, or visible light band-pass.

8. The light-sensing device according to claim 1, wherein the at least one chemical coating light-sensing pixel layer is disposed on a substrate, and the at least one semiconductor light-sensing pixel layer is disposed on another substrate.

9. The light-sensing device according to claim 1, wherein the chemical coating light-sensing pixel comprises a quantum dot light-sensing pixel; and/or,
wherein the semiconductor light-sensing pixel comprises a CMOS light-sensing diode, a CMOS light-sensing gate, a CCD light-sensing diode, a CCD light-sensing gate, and a CMOS and CCD light-sensing diode and light-sensing gate having a bidirectional charge transfer function.

* * * * *